US010522784B2

(12) United States Patent
Kishimoto

(10) Patent No.: US 10,522,784 B2
(45) Date of Patent: Dec. 31, 2019

(54) METHOD FOR PRODUCING ORGANIC ELECTROLUMINESCENT DEVICE AND FILM DEPOSITION APPARATUS

(71) Applicant: Sakai Display Products Corporation, Sakai-shi, Osaka (JP)

(72) Inventor: Katsuhiko Kishimoto, Osaka (JP)

(73) Assignee: Sakai Display Products Corporation, Osaka (JP)

(*) Notice: Subject to any disclaimer, the term of this patent is extended or adjusted under 35 U.S.C. 154(b) by 0 days.

(21) Appl. No.: 15/750,609

(22) PCT Filed: Mar. 8, 2017

(86) PCT No.: PCT/JP2017/009334
§ 371 (c)(1),
(2) Date: Sep. 18, 2018

(87) PCT Pub. No.: WO2018/163338
PCT Pub. Date: Sep. 13, 2018

(65) Prior Publication Data
US 2019/0363287 A1 Nov. 28, 2019

(51) Int. Cl.
H01L 51/00 (2006.01)
H01L 51/52 (2006.01)
(Continued)

(52) U.S. Cl.
CPC ........ H01L 51/5253 (2013.01); C23C 16/483 (2013.01); H01L 51/0097 (2013.01); H01L 51/56 (2013.01)

(58) Field of Classification Search
None
See application file for complete search history.

(56) References Cited

U.S. PATENT DOCUMENTS

2003/0205845 A1    11/2003  Pichler et al.
2009/0105395 A1*   4/2009   Kamata ................. C08G 77/20
                                                     524/502
(Continued)

FOREIGN PATENT DOCUMENTS

JP    2003-272834 A    9/2003
JP    2003-347045 A   12/2003
(Continued)

OTHER PUBLICATIONS

Decision to Grant for related Japanese Application No. 2017-559136 dated Mar. 27, 2018.
(Continued)

Primary Examiner — Alexander G Ghyka
(74) Attorney, Agent, or Firm — Renner, Otto, Boisselle & Sklar, LLP

(57) ABSTRACT

A method for producing an organic EL device in this disclosure includes the steps of providing an element substrate including a substrate and a plurality of organic EL devices arranged on the substrate; and forming a thin film encapsulation structure over the element substrate. The step of forming the thin film encapsulation structure includes the steps of forming a first inorganic barrier layer over the element substrate; condensing a photocurable resin on the first inorganic barrier layer; irradiating a plurality of selected regions of the photocurable resin with a laser beam to cure at least a part of the photocurable resin, thus to form a photocurable resin layer; removing an uncured part of the photocurable resin; and forming a second inorganic barrier layer, covering the photocurable resin layer, on the first inorganic barrier layer.

13 Claims, 20 Drawing Sheets

(51) Int. Cl.
*C23C 16/48* (2006.01)
*H01L 51/56* (2006.01)

(56) References Cited

U.S. PATENT DOCUMENTS

| | | | |
|---|---|---|---|
| 2010/0068838 A1* | 3/2010 | Ray | B82Y 20/00 |
| | | | 438/29 |
| 2010/0196679 A1 | 8/2010 | Morishima | |
| 2013/0146905 A1* | 6/2013 | Ray | B82Y 20/00 |
| | | | 257/88 |
| 2013/0230665 A1 | 9/2013 | Park | |
| 2014/0264300 A1 | 9/2014 | Kamiya | |
| 2016/0043340 A1 | 2/2016 | Ohara | |
| 2016/0043346 A1 | 2/2016 | Kamiya et al. | |
| 2016/0126495 A1 | 5/2016 | Oka et al. | |
| 2017/0222183 A1* | 8/2017 | Cho | H01L 51/5259 |
| 2017/0267859 A1* | 9/2017 | Uchida | H01L 23/293 |
| 2018/0026228 A1* | 1/2018 | Chida | H01L 51/5246 |
| | | | 257/40 |
| 2018/0102457 A1* | 4/2018 | Ray | B82Y 20/00 |
| 2019/0148462 A1* | 5/2019 | Tanaka | H01L 27/3209 |
| | | | 345/76 |

FOREIGN PATENT DOCUMENTS

| | | |
|---|---|---|
| JP | 2007-250370 A | 9/2007 |
| JP | 2007-284680 A | 11/2007 |
| JP | 2008-161749 | 7/2008 |
| JP | 2009-037798 A | 2/2009 |
| JP | 2009-205941 A | 9/2009 |
| JP | 2013-064187 A | 4/2013 |
| JP | 2013-186971 A | 9/2013 |
| JP | 2013-187190 A | 9/2013 |
| JP | 2013-247021 A | 12/2013 |
| JP | 2014-179278 A | 9/2014 |
| JP | 2015-176717 A | 10/2015 |
| JP | 2016-039078 A | 3/2016 |
| JP | 2016-039120 A | 3/2016 |
| JP | 2016-076467 A | 5/2016 |
| WO | WO 2005/101542 A1 | 10/2005 |
| WO | WO 2012/053532 A1 | 4/2012 |
| WO | WO 2014/196137 A1 | 12/2014 |

OTHER PUBLICATIONS

Office Action for related Japanese Application No. 2017-559136 dated Jan. 30, 2018.

* cited by examiner (a)

(b)

(a)

(b)

(a)

(b)

(a)

(b)

(a)

(b)

(c)

(a)

(b)

(c)

METHOD FOR PRODUCING ORGANIC ELECTROLUMINESCENT DEVICE AND FILM DEPOSITION APPARATUS

TECHNICAL FIELD

The present invention relates to a method for producing an organic EL device, specifically, a flexible organic EL device, and a film deposition apparatus. Typical examples of the organic EL device are an organic EL display device and an organic EL illumination device.

BACKGROUND ART

Organic EL (Electro-Luminescence) display devices start being put into practical use. One feature of an organic EL display device is being flexible. An organic EL display device includes, in each of pixels, at least one organic EL element (Organic Light Emitting Diode: OLED) and at least one TFT (Thin Film Transistor) for controlling an electric current to be supplied to each of the at least one OLED. Hereinafter, an organic EL display device will be referred to as an "OLED display device". An OLED display device including a switching element such as a TFT for each of OLEDs is called an "active matrix OLED display device". A substrate including the TFTs and the OLEDs which are formed thereon will be referred to as an "element substrate".

An OLED (especially, an organic light emitting layer and a cathode electrode material) is easily affected by moisture to be deteriorated and to cause display unevenness. One technology developed in order to provide an encapsulation structure that protects the OLED against moisture while not spoiling the flexibility of the OLED display device is a thin film encapsulation (TFE) technology. According to the thin film encapsulation technology, inorganic barrier layers and organic barrier layers are stacked alternately to allow thin films to provide a sufficient level of water vapor barrier property. From the point of view of moisture-resistance reliability of the OLED display device, such a thin film encapsulation structure is typically required to have a WVTR (Water Vapor Transmission Rate) of $1 \times 10^{-4}$ g/m$^2$/day or less.

A thin film encapsulation structure used in OLED display devices commercially available currently includes an organic barrier layer (polymer barrier layer) having a thickness of about 5 μm to about 20 μm. Such a relatively thick organic barrier layer also has a role of flattening a surface of the element substrate. However, such a thick organic barrier layer involves a problem that the bendability of the OLED display device is limited.

There is also a problem that the mass-productivity is low. The relatively thick organic barrier layer described above is formed by use of a printing technology such as an inkjet method, a microjet method or the like. By contrast, the inorganic barrier layer is formed by a thin film deposition technology in a vacuum atmosphere (e.g., 1 Pa or less). The formation of the organic barrier layer by use of a printing method is performed in the air or a nitrogen atmosphere, whereas the formation of the inorganic barrier layer is performed in vacuum. Therefore, the element substrate is put into, and out of, a vacuum chamber during the formation of the thin film encapsulation structure, which decreases the mass-productivity.

In such a situation, as disclosed in, for example, Patent Document 1, a film deposition apparatus capable of producing an inorganic barrier layer and an organic barrier layer continuously has been developed.

Patent Document 2 discloses a thin film encapsulation structure including a first inorganic material layer, a first resin member and a second inorganic material layer provided on the element substrate in this order. In this thin film encapsulation structure, the first resin member is present locally, namely, in the vicinity of a protruding portion of the first inorganic material layer (first inorganic material layer covering a protruding component). According to Patent Document 2, the first resin member is present locally, namely, in the vicinity of the protruding component, which may not be sufficiently covered with the first inorganic material layer. With such a structure, entrance of moisture or oxygen via the non-covered portion is suppressed. In addition, the first resin member acts as an underlying layer on which the second inorganic material layer is to be formed. Therefore, the second inorganic material layer is properly formed and properly covers a side surface of the first inorganic material layer with an expected thickness. The first resin member is formed as follows. An organic material heated and gasified to be mist-like is supplied onto an element substrate maintained at room temperature or a lower temperature. As a result, the organic material is condensed and put into drops on the substrate. The organic material in drops moves on the substrate by a capillary action or a surface tension to be present locally, namely, at a border between a side surface of the protruding portion of the first inorganic barrier layer and a surface of the element substrate. Then, the organic material is cured to form the first resin member at the border. Patent Document 3 also discloses an OLED display device including a similar thin film encapsulation structure.

Patent Document 4 discloses a film deposition apparatus usable to produce an OLED display device.

CITATION LIST

Patent Literature

Patent Document No. 1: Japanese Laid-Open Patent Publication No. 2013-186971
Patent Document No. 2: WO2014/196137
Patent Document No. 3: Japanese Laid-Open Patent Publication No. 2016-39120
Patent Document No. 4: Japanese Laid-Open Patent Publication No. 2013-64187

SUMMARY OF INVENTION

Technical Problem

The thin film encapsulation structure described in each of Patent Documents 2 and 3 does not include a thick organic barrier layer, and therefore, is considered to improve the bendability of the OLED display device. In addition, since the inorganic barrier layer and the organic barrier layer may be formed continuously, the mass-productivity is also improved.

However, according to the studies made by the present inventor, an organic barrier layer formed by the method described in Patent Document 2 or 3 has a problem of not providing a sufficient level of moisture-resistance reliability.

In the case where an organic barrier layer is formed by use of a printing method such as an inkjet method or the like, it is possible to form the organic barrier layer only in an active region on the element substrate (the active region may also be referred to as an "element formation region" or a "display region") but not in a region other than the active region. In this case, in the vicinity of the active region (outer to the active region), there is a region where the first inorganic material layer and the second inorganic material layer are in direct contact with each other, and the organic barrier layer is fully enclosed by the first inorganic material layer and the second inorganic material layer and is insulated from the outside of the first inorganic material layer and the second inorganic material layer.

By contrast, according to the method for forming the organic barrier layer described in Patent Documents 2 or 3, a resin (organic material) is supplied to the entire surface of the element substrate, and the surface tension of the resin in a liquid state is used to put the resin at the border between the surface of the element substrate and the side surface of the protruding portion on the surface of the element substrate. Therefore, the organic barrier layer may also be formed in a region other than the active region (the region other than the active region may also be referred to as a "peripheral region"), namely, a terminal region where a plurality of terminals are located and a lead wire region where lead wires extending from the active region to the terminal region are formed. Specifically, an ultraviolet-curable resin is present locally, namely, at, for example, the border between the surface of the element substrate and side surfaces of the lead wires or side surfaces of the terminals. In this case, an end of a part, of the organic barrier layer, that is formed along the lead wires is not enclosed by the first inorganic barrier layer and the second inorganic barrier layer, but is exposed to the air (ambient atmosphere).

The organic barrier layer is lower in the water vapor barrier property than the inorganic barrier layer. Therefore, the organic barrier layer formed along the lead wires acts as a route that leads the water vapor in the air into the active region.

The present invention provides a method for producing an organic EL device and a film deposition apparatus solving the above-described problems.

Solution to Problem

In an illustrative embodiment, a method for producing an organic EL device of this disclosure includes the steps of providing an element substrate including a substrate that includes an active region and a peripheral region outer to the active region and also including an electrical circuit supported by the substrate, the electrical circuit including a plurality of EL elements formed on the active region and a back plane circuit for driving the plurality of organic EL elements, the back plane circuit including a plurality of lead wires each including a terminal on the peripheral region; and forming a thin film encapsulation structure over the plurality of EL elements in the element substrate and on a part of the plurality of lead wires that is on the active region. The step of forming the thin film encapsulation structure includes the steps of forming a first inorganic barrier layer over the element substrate; condensing a photocurable resin in a liquid-state on the first inorganic barrier layer; irradiating a selected region of the photocurable resin with a laser beam having a wavelength of 400 nm or shorter to cure at least a part of the photocurable resin, thus to form a photocurable resin layer while forming an opening in the photocurable resin layer on each of the plurality of lead wires; ashing a part of a surface of the photocurable resin layer to form an organic barrier layer; and forming a second inorganic barrier layer, covering the organic barrier layer, on the first inorganic barrier layer.

In an embodiment, in the step of condensing the photocurable resin in the liquid state, the photocurable resin condensed on a flat portion of the first inorganic barrier layer has a thickness of 100 nm or greater and 500 nm or less.

In an embodiment, the step of forming the organic barrier layer includes the step of generating the laser beam from laser light emitted from at least one semiconductor laser device.

In an embodiment, the substrate is a flexible substrate.

In an embodiment, the photocurable resin contains an acrylic monomer.

In an illustrative embodiment, a method for producing an organic EL device of this disclosure includes the steps of providing an element substrate including a substrate and a plurality of organic EL devices arranged on the substrate; and forming a thin film encapsulation structure over the element substrate. The step of forming the thin film encapsulation structure includes the steps of forming a first inorganic barrier layer over the element substrate; condensing a photocurable resin on the first inorganic barrier layer; irradiating a plurality of selected regions of the photocurable resin with a laser beam to cure at least a part of the photocurable resin, thus to form a photocurable resin layer; removing an uncured part of the photocurable resin; and forming a second inorganic barrier layer, covering the photocurable resin layer remaining on the substrate, on the first inorganic barrier layer.

In an embodiment, the plurality of regions of the photocurable resin are selected such that an active region of each of the organic EL devices is enclosed by a region where the first inorganic barrier layer and the second inorganic barrier layer are in contact with each other without having an organic barrier layer therebetween.

In an embodiment, the plurality of regions of the photocurable resin respectively cover the active regions of the organic EL devices, and are separated from each other.

In an illustrative embodiment, a film deposition apparatus of this disclosure includes a chamber comprising a stage for supporting a substrate; a material supply device for supplying a vapor-like or mist-like photocurable resin into the chamber; and a light source device for irradiating a plurality of selected regions of the substrate supported by the stage with a laser beam. The light source device includes at least one semiconductor laser device for emitting the laser beam; and an optical device for adjusting an intensity distribution, on the substrate, of the laser beam emitted from the semiconductor laser device.

In an embodiment, the optical device includes at least one movable mirror for scanning the plurality of selected regions of the substrate with the laser beam.

In an embodiment, the light source device includes a plurality of semiconductor laser devices including the at least one semiconductor laser device, and irradiates the plurality of selected regions of the substrate with a plurality of laser beams emitted from the plurality of semiconductor laser devices.

In an embodiment, the light source device includes a driving device for moving the plurality of semiconductor laser devices with respect to the substrate.

In an embodiment, the optical device adjusts the intensity distribution such that at least a part of the photocurable resin condensed on the substrate is not cured.

In an embodiment, the optical device includes a transmissive or reflective spatial light modulator modulating the intensity distribution.

Advantageous Effects of Invention

An embodiment of the present invention provides a method for producing an organic EL device including a thin film encapsulation structure that is improved in the mass-productivity and the moisture-resistance reliability, and a film deposition apparatus usable for the method.

BRIEF DESCRIPTION OF DRAWINGS

FIG. 14(a) is a cross-sectional view taken along line 3A-3A' in FIG. 13, FIG. 14(b) is a cross-sectional view taken along line 3B-3B' in FIG. 13, FIG. 14(c) is a cross-sectional view taken along line 3C-3C' in FIG. 13, and FIG. 14(d) is a cross-sectional view taken along line 3D-3D' in FIG. 13.

FIG. 18(a) is a cross-sectional view of a portion including a particle P, and FIG. 18(b) is a cross-sectional view of a portion including an inorganic barrier layer joint portion 3DB substantially enclosing an active region formed on an underlying surface (e.g., surface of the OLED 3) on which an for an organic barrier layer 14D is to be formed.

DESCRIPTION OF EMBODIMENTS

Figure 1A:
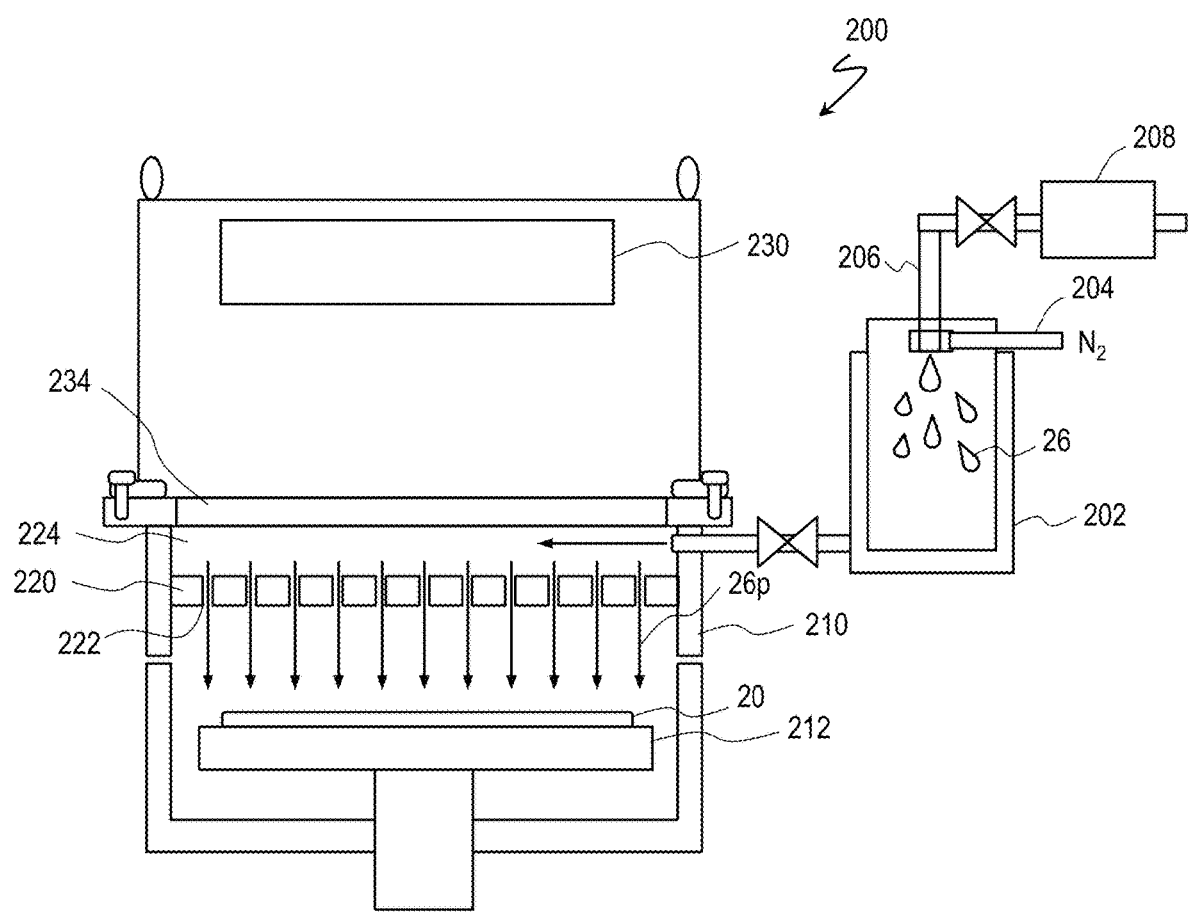
FIG. 1A is a schematic view showing a structure of a film deposition apparatus 200 usable to form an organic barrier layer 14.

In an illustrative embodiment, an "element substrate" in this disclosure includes a substrate (base) including an active region and a peripheral region outer to the active region, and also includes an electrical circuit supported by the substrate. A typical example of the electrical circuit includes a plurality of organic EL elements formed on the active region and a back plane circuit for driving the plurality of organic EL elements. The back plane circuit includes a plurality of lead wires each including a terminal on the peripheral region.

Conventionally in order to form the organic barrier layer disclosed in Patent Document 2, a photocurable resin is condensed on an element substrate on which a first inorganic barrier layer is formed, and then the entire surface of the element substrate is irradiated with ultraviolet rays to cure the entirety of the photocurable resin. In a conventional film deposition apparatus, the ultraviolet rays are emitted from a high-pressure UV lamp.

By contrast, in an embodiment according to the present invention, a relatively thin photocurable resin in a liquid state is formed on a surface of an element substrate, and the relatively thin photocurable resin has a thickness of, for example, 500 nm or less on a flat portion of the element substrate. A plurality of selected regions of the element substrate in this state are irradiated with a laser beam. As a result, a part, of the photocurable resin, that is condensed in a region other than the plurality of selected regions (light exposure regions) (namely, the part of the photocurable resin that is condensed in a non-light exposure region) is not cured. Such an unnecessary part of the photocurable resin is allowed to be selectively removed from the element substrate. Therefore, the problem that a part of the organic barrier layer forms a route that guides water vapor in the air into the active region is solved.

In an embodiment according to the present invention, between the first inorganic barrier layer and the second inorganic barrier layer included in the thin film encapsulation structure, the organic barrier layer (solid portion) is limited to be present in a selected region. The entirety of the thin film encapsulation structure is substantially defined by the shapes of the first inorganic barrier layer and the second inorganic barrier layer. As seen in a direction normal to the substrate, the region where the organic barrier layer is present is inner to an outer circumference (profile) of the thin film encapsulation structure.

In an embodiment according to the present invention, a coherent laser beam emitted from, for example, a semiconductor laser device is used. Therefore, the linearity of the light beam is high, and selective exposure to light is realized without a mask being put into close contact with the element substrate. Thus, even in the case where the element substrate is located in the film deposition apparatus in a state where a photocurable resin in a liquid state is formed on a surface of the element substrate, a desired region of the element substrate is selectively exposed to light in this state. There is a conventional problem that if the element substrate having a photocurable resin in a liquid state (in a wet state) formed thereon is moved or vibrated before the photocurable resin is exposed to light or cured, the photocurable resin is moved from the position of condensation and the organic barrier layer is not formed at a desired position. Such a problem is avoided in an embodiment according to the present invention.

FIG. 1A schematically shows an example of basic structure of a film deposition apparatus 200 preferably usable for a method for producing an organic EL device according to the present invention. The film deposition apparatus 200 is used to form an organic barrier layer included in a thin film encapsulation structure.

The film deposition apparatus 200 shown in the figure includes a chamber 210 and a partition wall 234 dividing an inner space of the chamber 210 into two spaces. In one of the spaces in the chamber 210 demarcated by the partition wall 234, a stage 212 and a shower plate 220 are located. In the other space demarcated by the partition wall 234, a light source device (ultraviolet ray irradiation device) 230 is located. The inner space of the chamber 210 is controlled to have a predetermined pressure (vacuum degree) and a predetermined temperature.

The stage 212 has a top surface that supports an element substrate 20. The top surface may be cooled down to, for example, −20° C. As described below in detail, the element substrate 20 includes, for example, a flexible substrate and a plurality of organic EL devices located on the flexible substrate. The element substrate 20 is placed on the stage 212 in a state where the first inorganic barrier layer (not shown in FIG. 1) included in the thin film encapsulation structure is formed on the element substrate 20. The first inorganic barrier layer is an underlying layer on which an organic barrier layer is to be formed.

A gap 224 is formed between the shower plate 220 and the partition wall 234. The gap 224 may have a size of, for example, 100 mm or greater and 1000 mm or less in a vertical direction. The shower plate 220 has a plurality of through-holes 222. The plurality of through-holes 222 each act as a material supply nozzle. A photocurable resin (in a liquid state), supplied in a predetermined amount to the gap 224, is supplied in a vapor or mist state to the element substrate 20 in the chamber 210 via the plurality of through-holes 222. As necessary, the photocurable resin is heated. A typical example of the photocurable resin is an acrylic monomer. In the example shown in the figure, a vapor-like or mist-like acrylic monomer 26p is attached to, or contacts, the first inorganic barrier layer over the element substrate 20. An acrylic monomer 26 is supplied from a container 202 into the chamber 210 at a predetermined flow rate. The container 202 is supplied with the acrylic monomer 26 via a pipe 206 and also is supplied with nitrogen gas from a pipe 204. The flow rate of the acrylic monomer supplied to the container 202 is controlled by a mass flow controller 208. A material supply device includes the shower plate 220, the pipe 204, the mass flow controller 208 and the like.

Figure 1B:
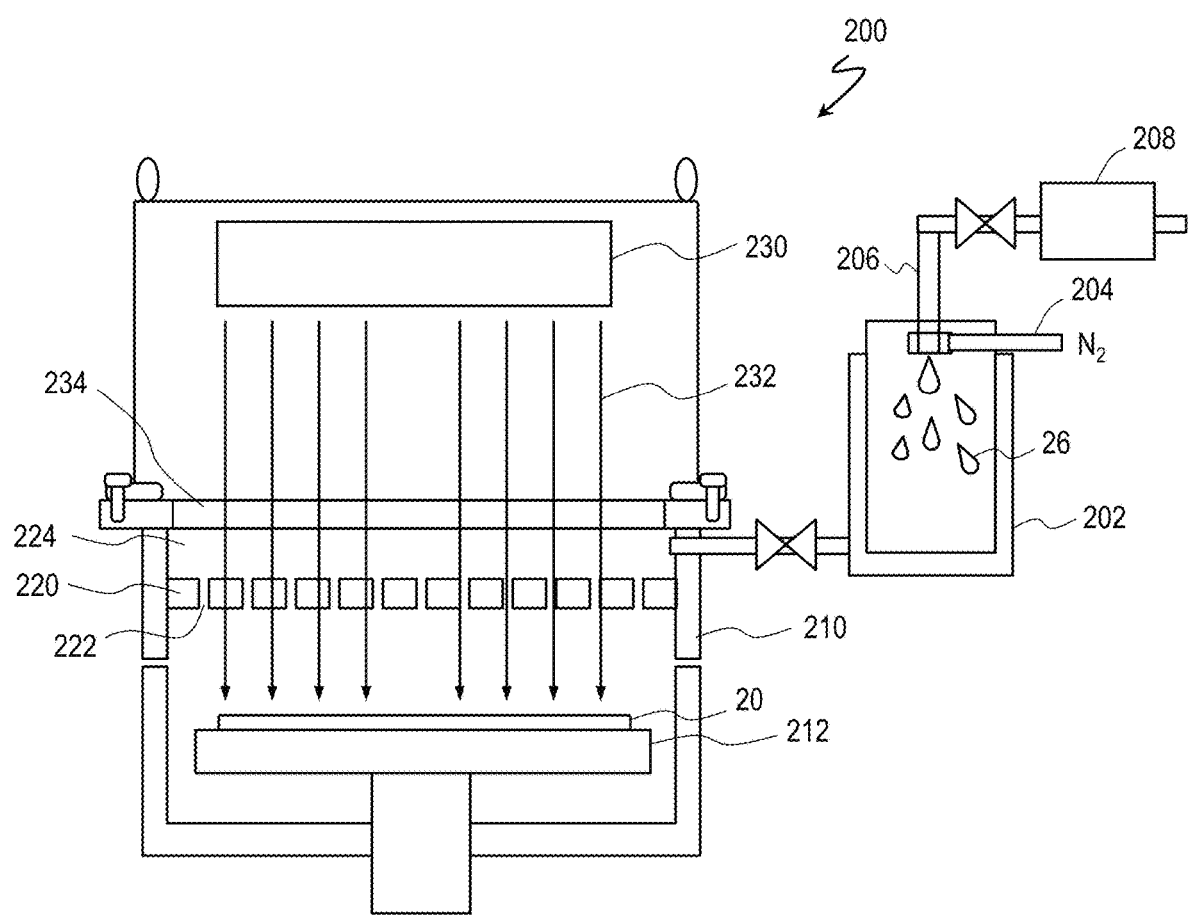
FIG. 1B is a schematic view showing a state where laser beams 232 are emitted from a light source device 230 included in the film deposition apparatus 200.

The light source device 230 is configured to irradiate a plurality of selected regions of the element substrate 20 supported by the stage 212 with laser beams 232. FIG. 1B is a schematic view showing a state where the laser beams 232 are emitted from the light source device 230. As described above, the space in which the light source device 230 is located in the chamber 210 of the film deposition apparatus 200 is separated, by the partition wall 234, from the space supplied with the material gas. The partition wall 234 and the shower plate 220 are formed of a material transmitting the laser beams 232 (e.g., quartz). The structure of the film deposition apparatus in this disclosure is not limited to the example shown here.

Hereinafter, with reference to FIG. 2 through FIG. 11B, an example of structure of the light source device 230 will be described in detail.

Figure 2:
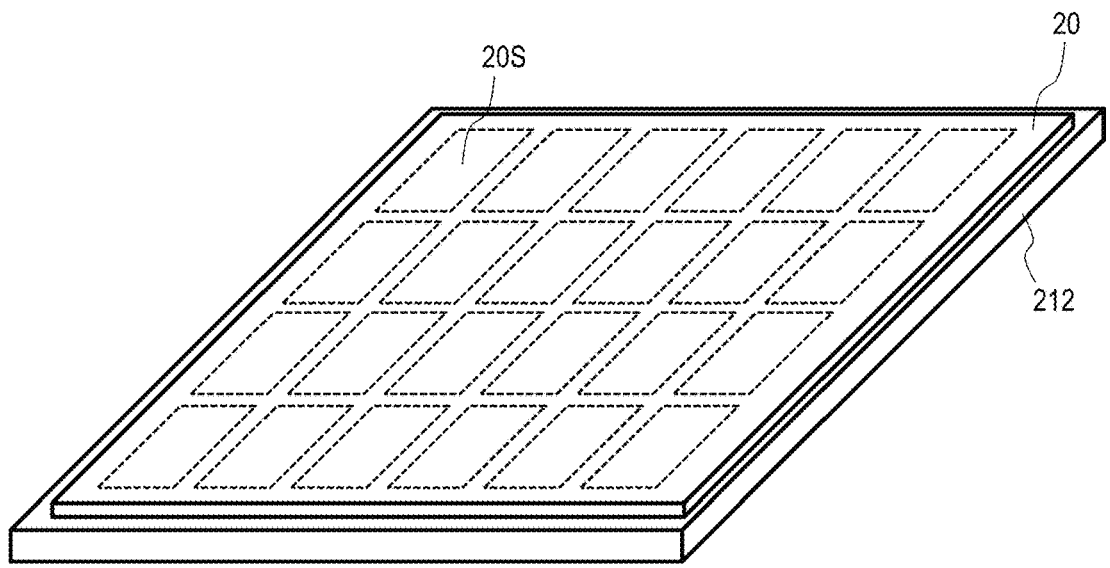
FIG. 2 is an isometric view showing an example of positional arrangement of a plurality of regions (irradiation regions) 208, of an element substrate 20, to be irradiated with the laser beam emitted from the light source device 230.

FIG. 2 is an isometric view showing an example of positional arrangement of a plurality of regions (irradiation regions) 208, of the element substrate 20, to be irradiated with the laser beam emitted from the light source device 230. Rectangular regions enclosed by the dashed line are respectively the irradiation regions 20S, which are separated from each other. FIG. 2 shows 24 irradiation regions 20S arranged in four rows by six columns as an example. The number and the positional arrangement of the irradiation regions 20S are not limited to the example shown in the figure. The shape and the size of each of the irradiation regions 20S are not limited to the example shown in the figure.

Figure 3:
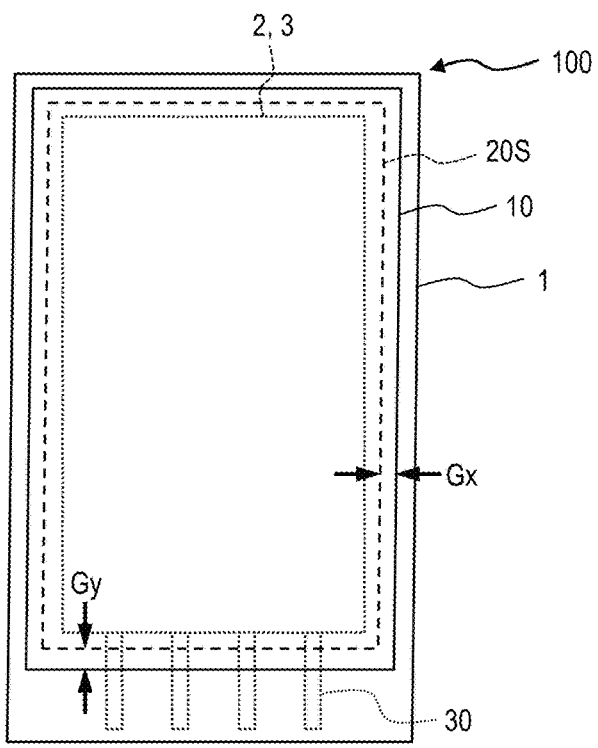
FIG. 3 schematically shows an example of positional relationship between one OLED display device 100 formed at the element substrate 20 and the irradiation region 208 corresponding to this OLED display device 100.
Figure 3:
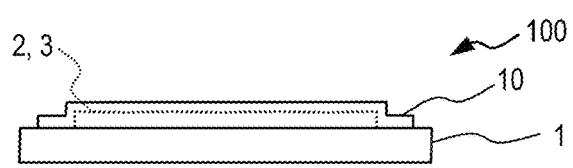

FIG. 3 schematically shows an example of positional relationship between one OLED display device 100 formed at the element substrate 20 and the irradiation region 208 corresponding to the OLED display device 100. A top part of FIG. 3 shows a plan view showing a layout, and a bottom part of FIG. 3 shows a cross-sectional structure.

In the example shown in FIG. 3, the OLED display device 100 includes a substrate 1, a circuit (back plane circuit) 2 supported by the substrate 1, and an OLED 3 formed on the circuit 2. The element substrate 20 shown in FIG. 2 is on a stage before the substrate 1 is divided into a plurality of the substrates 1 of the OLED display devices 100 as shown in FIG. 3. The substrates 1 of the plurality of OLED display devices 100 are each a part of one continuous base included in the element substrate 20.

The entirety of the circuit 2 and the OLED 3 shown in FIG. 3 is covered and sealed with the thin film encapsulation (TFE) structure 10. As shown in FIG. 3, one irradiation region 208 is larger than a region where the circuit 2 and the OLED 3 are formed, but is smaller than a region where the TFE structure 10 is formed. Therefore, in an intermediate region from an outer edge of the irradiation region 20s to an outer edge of the region where the TFE structure 10 is formed (such an intermediate region is included in a non-light exposure region), a photocurable resin such as the acrylic monomer 26 or the like, even if being condensed, is not cured, and thus an organic barrier layer is not formed. As a result, in the "intermediate region", the first inorganic barrier layer and the second inorganic barrier layer included in the TFE structure 10 are in direct contact with each other. As described below, in this specification, a portion where the first inorganic barrier layer and the second inorganic barrier layer are in direct contact with each other may be referred to as an "inorganic barrier layer joint portion". In the example shown in FIG. 3, the "inorganic barrier layer joint portion" includes a portion extending in a length direction and having a width Gx and a portion extending in a width direction and having a width Gy, and encloses the circuit 2 and the OLED 3.

The OLED display device 100 shown in FIG. 3 includes a plurality of lead wires 30 connecting the circuit 2 with, for example, a driver integrated circuit (IC). In this disclosure, the circuit 2 and the plurality of lead wires will be collectively referred to as "electrical circuitry". In the example shown in FIG. 3, four lead wires 30 are shown for the sake of simplicity. In actuality, the number of the lead wires 30 is not limited to the number in this example. The lead wires 30 do not need to extend linearly, but may include a bent portion and/or a branched portion.

The lead wires 30 extend from the circuit 2 to the outside of the above-described "intermediate region". Namely, a part of each of the lead wires 30 is covered with the TFE structure 10, but the remaining part of each of the lead wires 30 (at least an end acting as a pad, namely, a terminal) is not covered with the TFE structure 10. The part of each lead wire 30 that is not covered with the TFE structure 10 may electrically contact and may be connected with, for example, a terminal of the driver integrated circuit (IC).

Figure 4:
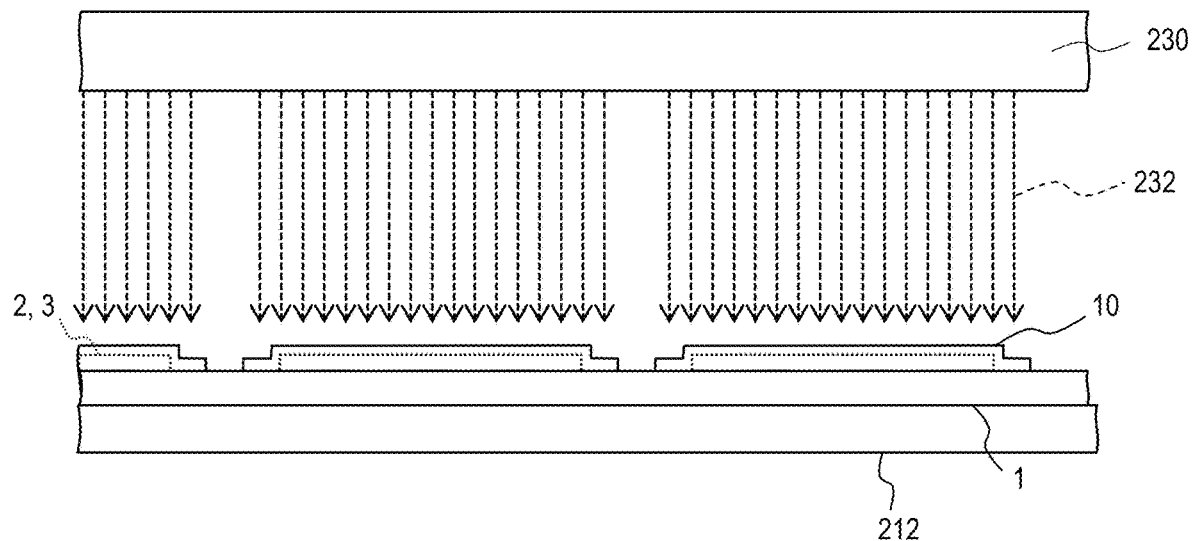
FIG. 4 schematically shows how the plurality of irradiation regions 20S are irradiated with the laser beams 232.

FIG. 4 schematically shows how the plurality of irradiation regions 20S are irradiated with the laser beams 232 (maskless projection light exposure). As shown in FIG. 3, the plurality of irradiation regions 20S each cover a region of the corresponding OLED display device 10 where the organic barrier layer needs to be formed. Oppositely described, a region of each OLED display device 100 where the organic barrier layer does not need to be formed is not irradiated with the laser beams 232. It is not required that a region outer to the irradiation regions 20S (non-light exposure region) is not irradiated with the laser beams 232 at all. If the radiation dose provided by the laser beams 232 to a certain region is lower than a level required to cure the photocurable resin, the certain region is a "non-light exposure region", and is not a region selected to be exposed to light (not an irradiation region). In order to cure an acrylic monomer layer having a thickness of, for example, 100 to 500 nm with ultraviolet rays (having a wavelength of, for example, 370 to 390 nm), a radiation dose of, for example, 100 to 200 mJ/cm$^2$ is required. In this case, in a region other than the selected regions (irradiation regions 20S), the radiation dose provided by the laser beams 232 may be suppressed to, for example, 50 mJ/cm$^2$ or less.

FIG. 4 shows that the plurality of irradiation regions 20S are irradiated with the plurality of laser beams 232 at the same time. The plurality of irradiation regions 208 do not need to be irradiated with the plurality of laser beams 232 at the same time. The plurality of irradiation regions 20S may be irradiated with a laser beam 232 sequentially. The laser beams 232 shown in FIG. 4 are each a bundle of parallel light beams. In actuality, the laser beams 232 may each be converged or diverged. The angle of incidence of the laser beam 232 with respect to the element substrate 20 is not limited to being perpendicular. In the case where the laser beam 232 is incident obliquely, the cross-sectional shape of the laser beam 232 may be appropriately corrected in accordance with the angle of incidence such that the irradiation regions 20S have the shape shown in FIG. 3.

Figure 5A:
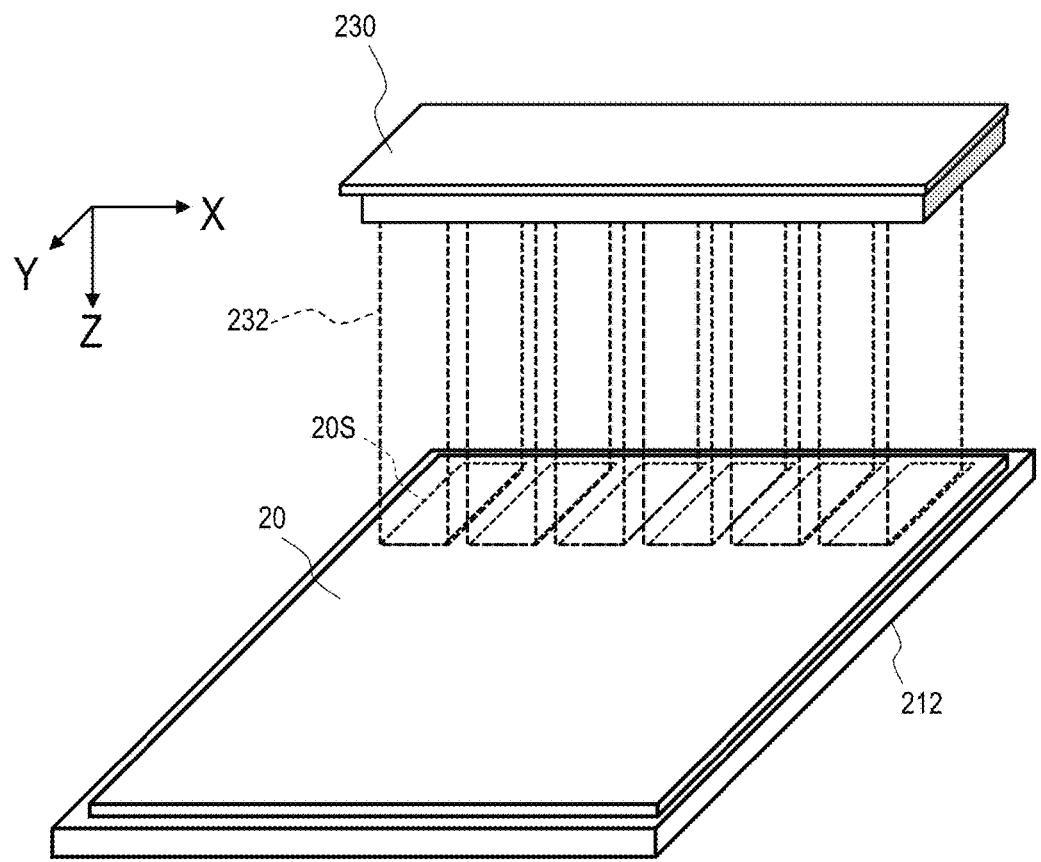
FIG. 5A is an isometric view showing an example in which the plurality of irradiation regions 20S are irradiated with the plurality of laser beams 232.

FIG. 5A is an isometric view schematically showing an example in which the plurality of irradiation regions 20S arranged in a line are irradiated with a plurality of laser beams 232. In this figure, coordinate axes including an X axis, a Y axis and a Z axis perpendicular to each other are shown for reference. In this example, the light source device 230 is configured to emit the laser beam 232 from each of a plurality of light emitting portions arranged in a line in an X-axis direction. The plurality of light emitting portions may each be one semiconductor laser device or an array of a plurality of semiconductor laser devices. In the example shown in FIG. 5A, the light source device 230 is supported so as to be movable at least in a Y-axis direction, and is driven by, for example a motor (not shown). The position of the light source device 230 may be changed by a driving device such as the motor or the like, so that different irradiation regions 20S, among the plurality of irradiation region 208, may be sequentially irradiated with the laser beams 232 at a plurality of different positions.

A plurality of the light source devices 230 each having the structure shown in FIG. 5A may be arranged in the Y-axis direction.

Figure 5B:
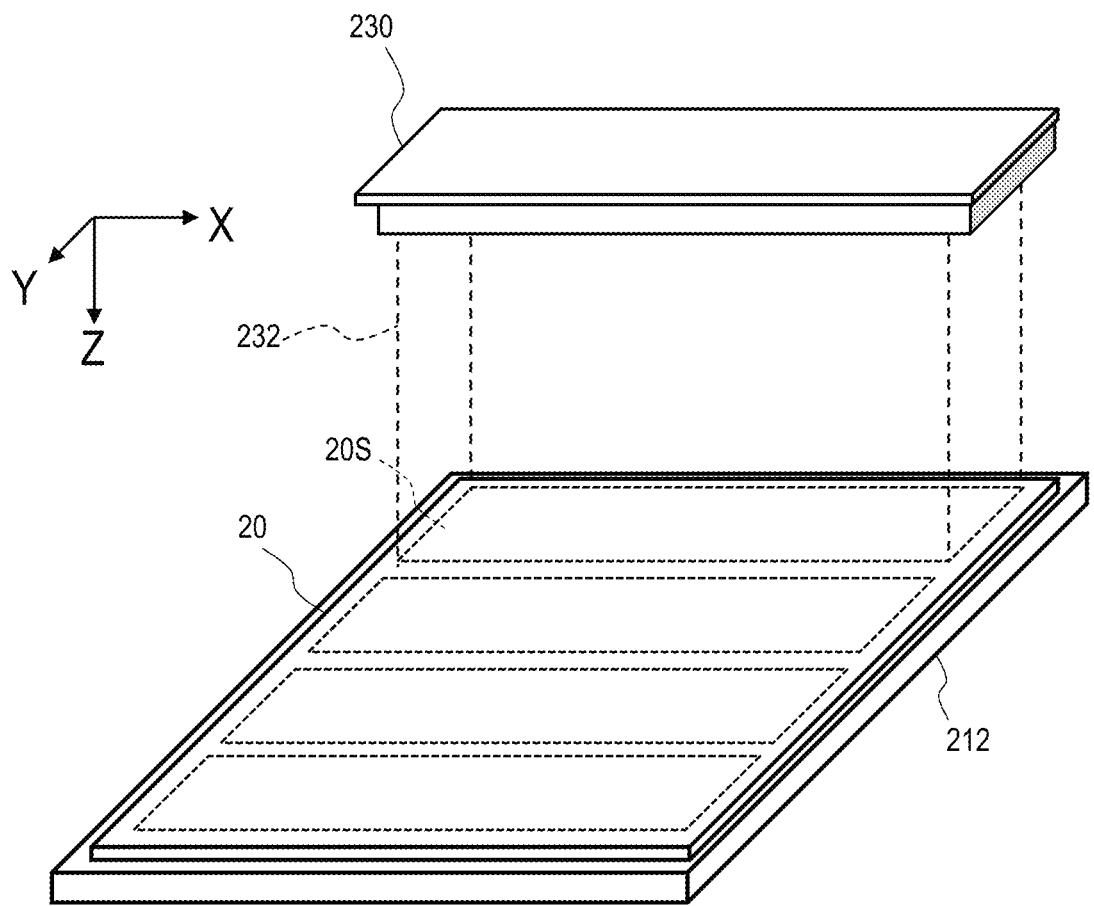
FIG. 5B is an isometric view showing an example in which the plurality of irradiation regions 20S are irradiated with line-like laser beams 232.

FIG. 5B shows an example in which one irradiation region 208 irradiated with the laser beam 232 extends in the X-axis direction so as to extend across a plurality of the OLED display device 100. Non-light exposure regions located between adjacent irradiation regions 20S extend like slits in the X-axis direction. The plurality of irradiation regions 208 are arranged in a pattern that is set such that the non-light exposure regions completely cross the lead wires 30. In the case where the photocurable resin is not formed on the flat portion, or in the case where the organic barrier layer formed on the flat portion is removed by ashing, the flat portion with no lead wire 30 may be irradiated with the laser beam. A reason for this is that the organic barrier layer may be removed from the flat portion in a later step. In such a case, although one irradiation region 20S extends across the plurality of OLED display devices 100 as shown in FIG. 5B, the organic barrier layer is not present in the vicinity of the active region of each of the OLED display devices 100. The organic barrier layer is not needed in the vicinity of the active region.

Figure 6:
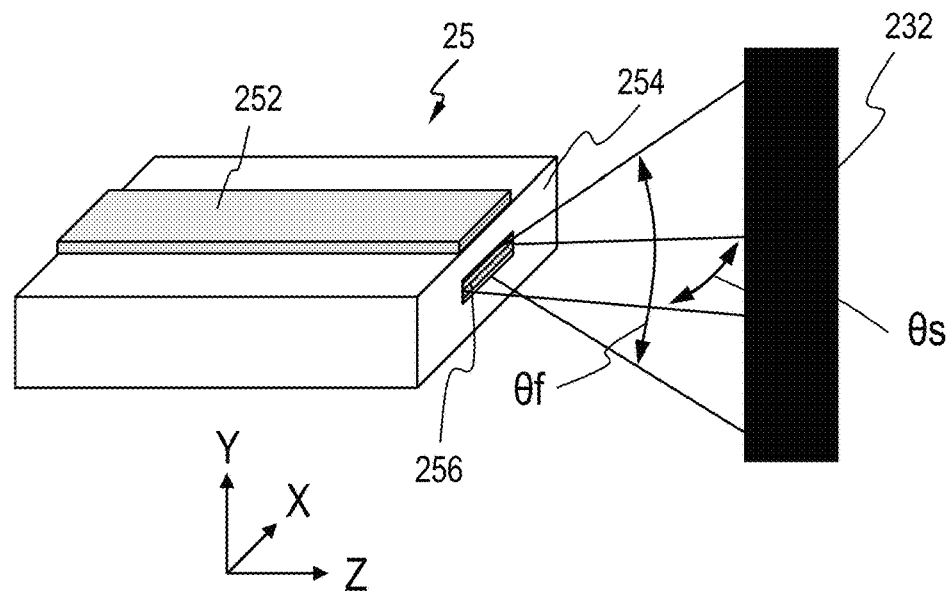
FIG. 6 is an isometric view schematically showing a basic structure of a typical semiconductor laser device.

FIG. 6 is an isometric view schematically showing a basic structure of a typical semiconductor laser device. A semiconductor laser device 25 shown in FIG. 6 includes a facet 254 including an emitter 256 for emitting the laser beam 232. A stripe-shaped electrode 252 is provided on a top surface of the semiconductor laser device 25. A bottom surface electrode (not shown) is provided on a bottom surface of the semiconductor laser device 25. When an electric current of a level exceeding a lasing threshold flows between the stripe-shaped electrode 252 and the bottom surface electrode, laser oscillation occurs and the laser beam 232 is emitted from the emitter 256.

The structure shown in FIG. 6 is merely a typical example of the semiconductor laser device 25, and is schematically shown in order to simplify the description. In the example shown in FIG. 6, the facet 254 of the semiconductor laser device 25 is parallel to an X-Y plane. Therefore, the laser beam 232 is emitted in a Z-axis direction from the emitter 256. An optical axis of the laser beam 232 is parallel to the Z-axis direction. A divergence of the laser beam 232 in the Y-axis direction is defined by angle θf, and a divergence of the laser beam 232 in the X-axis direction is defined by angle θs. Because of the diffraction effect, angle θf is usually larger than θs, and a cross-section of the laser beam 232 (portion having an intensity of a predetermined value or larger) is elliptical. Therefore, in this embodiment, the laser beam 232 emitted from the semiconductor laser device 25 is not used as it is to expose the photocurable resin, but the intensity distribution of the laser beam 232 is adjusted by an optical device such as a lens, an optical fiber or the like.

Figure 7:
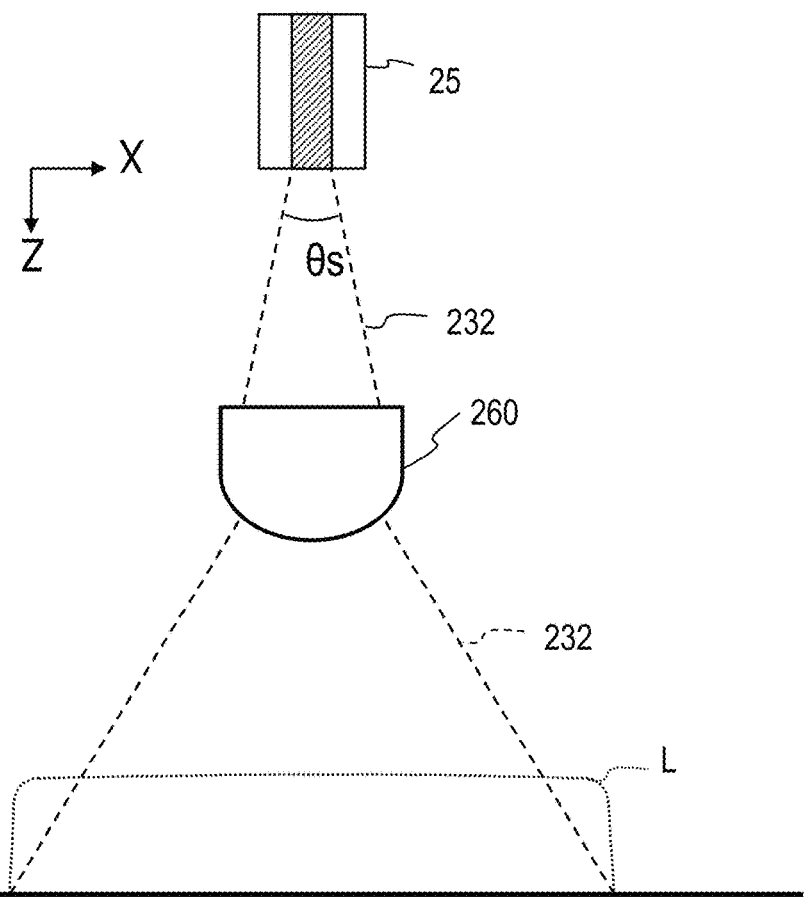
FIG. 7 shows an example of structure in which an intensity distribution of the laser beam 232 is converted into a top hat-shaped intensity distribution by use of a refraction-type optical device 260.

FIG. 7 shows an example of structure in which the intensity distribution of the laser beam 232 is converted into a top hat-shaped intensity distribution by use of a refraction-type optical device 260. The optical device 260 causes different types of refraction in an X-Z plane and a Y-Z plane from each other, and thus shapes the laser beam 232 such that the laser beam 232 has an intensity distribution matched to the irradiation region 20S shown in FIG. 3. FIG. 7 schematically shows an example of intensity distribution L in a cross-section (parallel to the X-Y plane) perpendicular to the optical axis (parallel to the Z-axis) of the laser beam 232. The intensity distribution L has a portion in which the intensity is almost uniform regardless of the position (has a flat portion). Such a shape of intensity distribution may be referred to as the "top hat shape". In the case where the cross-section of the laser beam having such a top hat-shaped intensity distribution matches the shape of the active region of the circuit 2 and the OLED 3 as shown in FIG. 3, selective exposure to light is performed efficiently.

An example of semiconductor laser device that emits a laser beam having a wavelength in an ultraviolet region (400 nm or shorter) may be a laser diode of product No. NDU7216 produced by Nichia Corporation. This laser diode provides a laser beam having a wavelength of 370 to 390 nm at a continuous wave (CW) output of 200 milliwatts (mW). A laser diode module of product No. NUU102E produced by Nichia Corporation provides a continuous wave laser beam having a wavelength of 370 to 390 nm at an output of 3 watts (W). Even in the case where a laser beam having a CW output of 3 watts (W) is emitted as being diverged to a region of 100 cm$^2$, a radiation dose of 300 mJ/cm$^k$ is realized in 10 seconds. Therefore, even if the laser beam is emitted for a short time as required for mass-production, a radiation dose of a level sufficient to cure a relatively thin photocurable resin layer (having a thickness of 100 to 500 nm on a flat portion of the first inorganic barrier) is provided.

Figure 8:
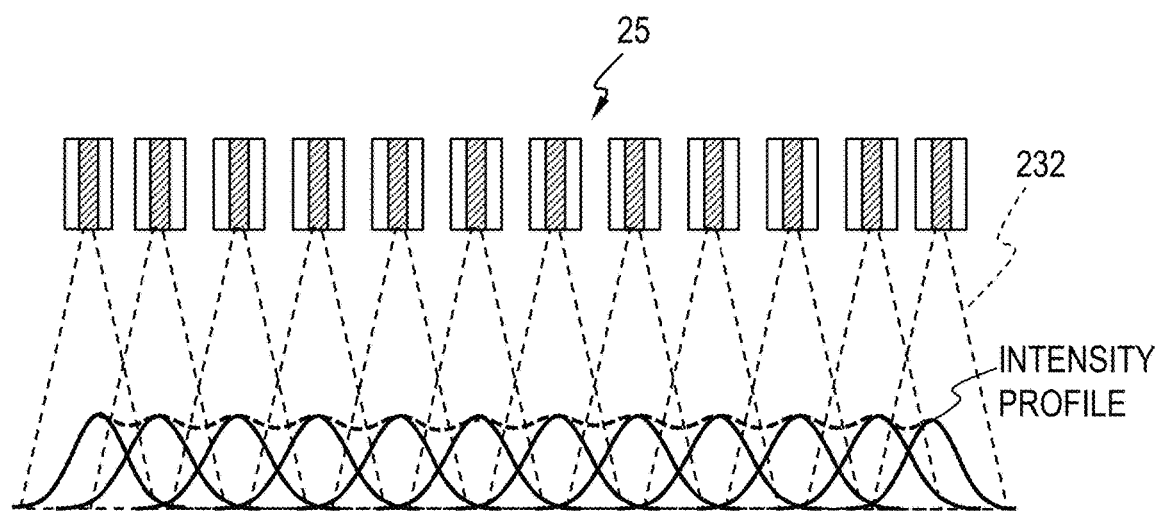
FIG. 8 shows an example in which a plurality of laser beams emitted from an array of a plurality of semiconductor laser devices 25 are synthesized to form one laser beam 232 having an intensity distribution of a top hat shape.

The irradiation regions 20S do not need to be irradiated with the laser beam 232 emitted from one semiconductor laser device 25. FIG. 8 shows an example in which a plurality of laser beams emitted from an array of a plurality of the semiconductor laser devices 25 are synthesized to form one laser beam 232 having an intensity distribution of a top hat shape. The plurality of semiconductor laser devices 25 do not need to emit the laser beams with the same optical output. The semiconductor laser devices 25 do not need to be arranged at an equal interval. The positions, orientations, outputs, wavelengths and the like of the semiconductor laser devices 25 may be appropriately adjusted so as to optimize the intensity distribution of the laser beam 23 on the element substrate. FIG. 8 omits the optical device such as a lens, a mirror or the like for the sake of simplicity. A known optical device may be used to realize a desired intensity distribution. The optical device may include a light-blocking mask having a slit or an opening transmitting a part of the laser beam 232. The laser beam is highly coherent and forms a precise light irradiation pattern defined by a narrow slit or opening.

Figure 9:
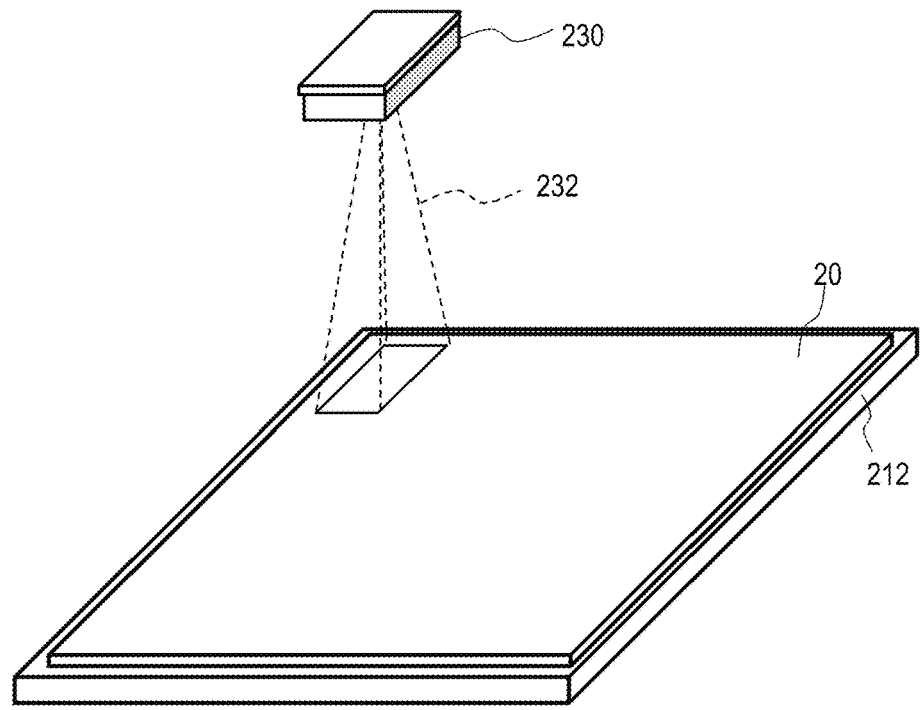
FIG. 9 schematically shows an example in which one irradiation region 208 is irradiated with the laser beam 232 from one light source device 230.

FIG. 9 schematically shows an example in which one irradiation region 208 is irradiated with the laser beam 232 from one light source device 230. In actuality, a plurality of the light source devices 230 may be located so as to face all the irradiation regions 20S. Alternatively, one or a plurality of source devices 230 may move to sequentially irradiate all the irradiation regions 20S with the laser beam 232.

Figure 10:
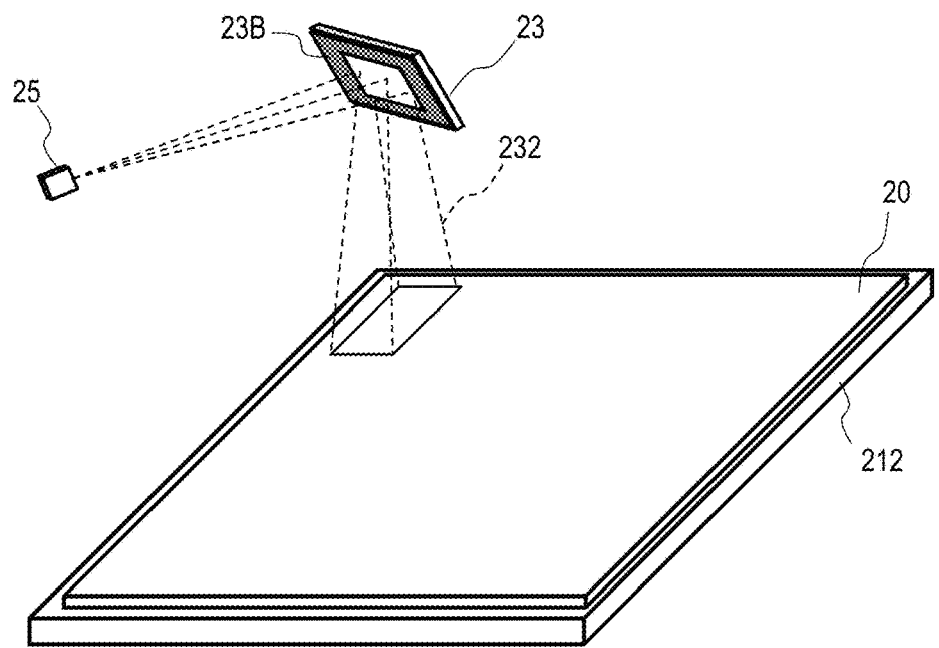
FIG. 10 shows an example of structure in which the laser beam 232 emitted from a fixed light source (e.g., one or a plurality of semiconductor laser devices 25) is reflected by a movable mirror 23 to sequentially irradiate the irradiation regions 20S.

FIG. 10 shows an example of structure in which the laser beam 232 emitted from a fixed light source (e.g., one or a plurality of semiconductor laser devices 25) is reflected by a movable mirror 23 to sequentially irradiate the irradiation regions 20S. The movable mirror 23 may be, for example, a polygon mirror or a Galvano mirror. The movable mirror 23 may include a non-reflective region 23B absorbing or scattering a part of the laser beam 232. The non-reflective region 233 adjusts the cross-sectional shape and the intensity distribution of the laser beam 232 on the element substrate 20. The orientation of the movable mirror 23 may be changed by, for example, a biaxial actuator (not shown), and thus may reflect the laser beam 232 in any direction. As described above, in order to realize the shape of the irradiation region 238 shown in FIG. 3 while the orientation of the movable mirror 23 is changed, it is preferred that the cross-sectional shape of the laser beam 232 is appropriately corrected in accordance with the angle of incidence (keystone correction). Such a correction is realized by putting an optical element (not shown) on an optical path and performing beam shaping. The number of the movable mirror(s) 23 and the number of the light source(s) are not limited to one but may be two or more.

The movable mirror 23 may be a reflective spatial light modulator (e.g., liquid crystal panel). Such a spatial light modulator dynamically changes the cross-sectional shape and the intensity distribution of the laser beam 232 on the element substrate 20.

A reflective or transmissive spatial light modulator may be used, instead of the movable mirror 23, to convert laser light emitted from the semiconductor laser device 25 into the laser beam 232 having an arbitrary intensity distribution. With such a structure, it is made possible to irradiate the entirety of, or a part of, the element substrate 20 with the laser beam 232 having an arbitrary intensity distribution. Keystone correction is made easily. In addition, it is made possible to easily change the shape, the size or the location of the irradiation regions 20S in accordance with the type of the element substrate 20. In the case where a transmissive spatial light modulator is used, the spatial light modulator may be located, for example, between a laser light source of the light source device 230 shown in FIG. 5A, FIG. 5B or FIG. 9 and the element substrate 20. The light source device 230 acts as a projector including a laser light source providing ultraviolet laser light.

Figure 11A:
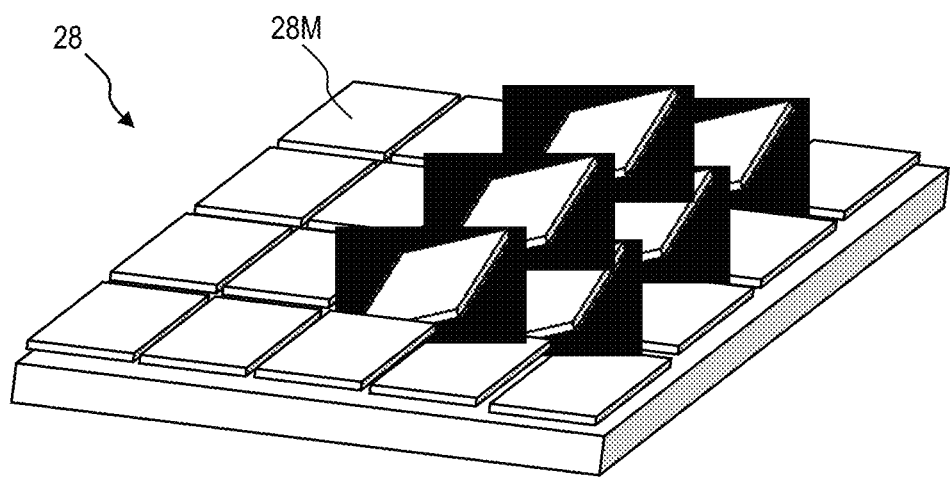
FIG. 11A is an isometric view schematically showing a state of a micro-mirror array 28.
Figure 11B:
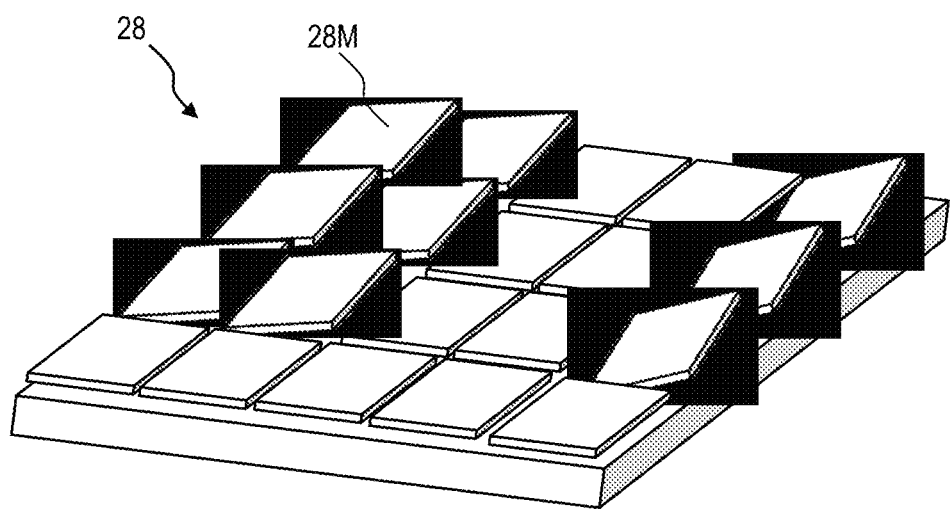
FIG. 11B is an isometric view schematically showing another state of the micro-mirror array 28.

The movable mirror 23 may be a micro-mirror array. FIG. 11A and FIG. 11B are isometric views schematically showing different states of a micro-mirror array 28. The 3*i* micro-mirror array 28 includes a plurality of microscopic mirrors 28M arranged two-dimensionally, an actuator that changes the orientation of each of the microscopic mirrors 28M, and a circuit that drives the actuator. The orientation or each or the microscopic mirrors 28M may be adjusted to spatially modulate the laser beam incident on the micromirror array 28, so that any region of the element substrate 20 is irradiated with the laser beam. The orientation of each of the microscopic mirrors 28M may be changed to scan the top surface of the element substrate 20 by the laser beam 232. The use of the micro-mirror array 28 allows the shape, the size and the locations of the irradiation regions 20S to be changed easily in accordance with the type of the element substrate 20.

With the film deposition apparatus 200 including the light source device 230 described above, it is made possible to perform a step of condensing the photocurable resin on the first inorganic barrier layer over the element substrate 20 and a step of irradiating the plurality of selected regions of the photocurable resin with the laser beam and curing at least a part of the photocurable resin to form a photocurable resin layer. The light source device usable for the film deposition apparatus according to the present invention is not limited to having the above-described structure. Any projection-type or scanning-type light source device that emits a laser beam in a wavelength that cures a photocurable resin is usable for the film deposition apparatus according to the present invention.

In embodiments described below, a step of removing a part, of the photocurable resin, that is not exposed to light and thus is not cured is performed, and then, a step of forming the second inorganic barrier layer, covering the photocurable resin layer remaining on the substrate, on the first inorganic barrier layer is performed. In this manner, the thin film encapsulation structure is formed.

(Example of Structure of the Display Device)

Hereinafter, an example of structure of a display device that may be produced in an embodiment according to the present invention will be described. An embodiment according to the present invention is not limited to the following embodiment.

Figure 12:
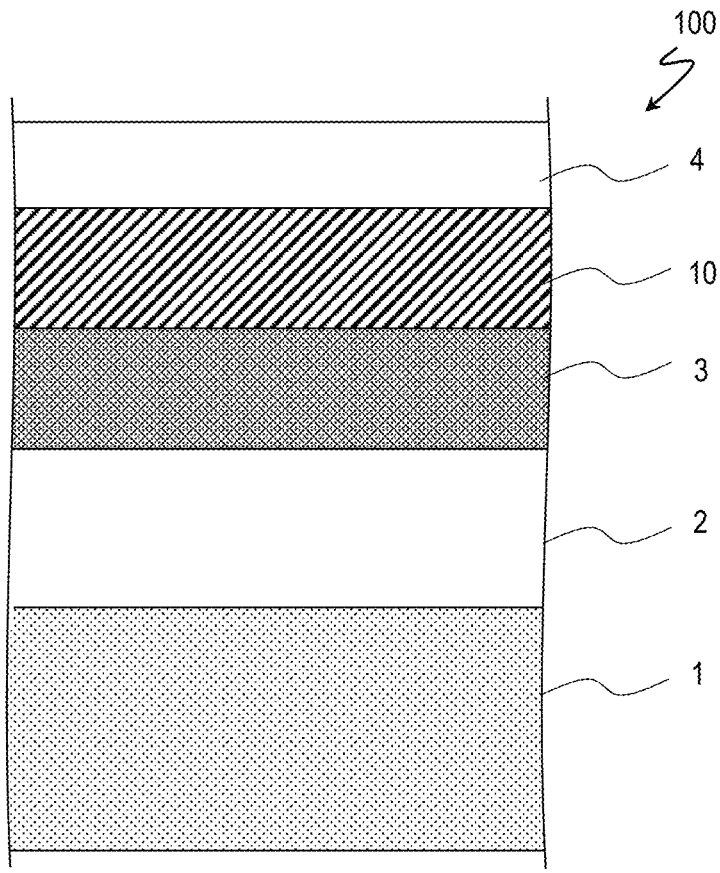
FIG. 12(a) is a schematic partial cross-sectional view of an active region of an OLED display device 100 in an embodiment according to the present invention.
FIG. 12(b) is a partial cross-sectional view of a TFE structure 10 formed on the OLED 3.
Figure 12:
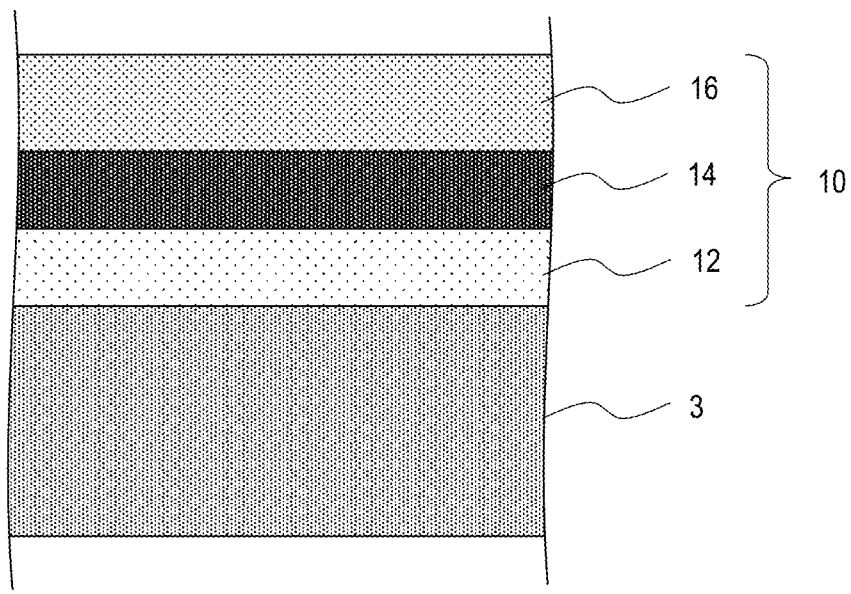

First, with reference to FIG. 12(a) and FIG. 12(b), a basic structure of an OLED display device 100 as an example of display device produced in an embodiment according to the present invention will be described. FIG. 12(a) is a schematic partial cross-sectional view of an active region of the OLED display device 100 in an embodiment according to the present invention. FIG. 12(b) is a partial cross-sectional view of a TFE structure 10 formed on an OLED 3. An OLED display device in each of embodiment 1 and embodiment 2 described below has basically the same structure, and may be the same as the OLED display device 100 except for the structure of the TFE structure 10.

The OLED display device 100 includes a plurality of pixels, and each of the pixels includes at least one organic EL element (OLED). Herein, a structure corresponding to one OLED will be described for the sake of simplicity.

As shown in FIG. 12(a), the OLED display device 100 includes a flexible substrate (hereinafter, may be referred to simply as a "substrate") 1, a circuit (back plane circuit) 2 that is formed on the substrate 1 and includes a TFT, the OLED 3 formed on the circuit 2, and the TFE structure 10 formed on the OLED 3. The OLED 3 is, for example, of a top emission type. An uppermost portion of the OLED 3 is, for example, a top electrode or a cap layer (refractive index adjusting layer). An optional polarization plate 4 is located on the TFE structure 10.

The substrate 1 is, for example, a polyimide film having a thickness of 15 µm. The circuit 2 including the TFT has a thickness of, for example, 4 µm. The OLED 3 has a thickness of, for example, 1 µm. The TFE structure 10 has a thickness of, for example, 1.5 µm or less.

FIG. 12(b) is a partial cross-sectional view of the TFE structure 10 formed on the OLED 3. A first inorganic barrier layer (e.g., SiN layer) 12 is formed immediately on the OLED 3. An organic barrier layer (e.g., acrylic resin layer) 14 is formed on the first inorganic barrier layer 12. A second inorganic barrier layer (e.g., SiN layer) 16 is formed on the organic barrier layer 14.

The first inorganic barrier layer 12 and the second inorganic barrier layer 16 are each, for example, an SiN layer having a thickness of 400 µm. The organic barrier layer 14 is, for example, an acrylic resin layer having a thickness less than 100 ram. The first inorganic barrier layer 12 and the second inorganic barrier layer 16 independently have a thickness of 200 nm or greater and 1000 nm or less. The organic barrier layer 14 has a thickness of 50 nm or greater and less than 200 nm. In the case where a particle described below is present on the first inorganic barrier layer 12, the thickness of the organic barrier layer 14 is increased locally, namely, in the vicinity of the particle and may become approximately the same as the thickness of the second inorganic barrier layer. The TFE structure 10 has a thickness of preferably 400 nm or greater and less than 2 µm, and more preferably of 400 nm or greater and less than 1.5 µm.

The TFE structure 10 is formed to protect an active region (see active region R1 in FIG. 13) of the OLED display device 100. At least in the active region, there are the first inorganic barrier layer 12, the organic barrier layer 14 and the second inorganic barrier layer 16 formed in this order on the OLED 3, with the first inorganic barrier layer 12 being closest to the OLED 3. The organic barrier layer 14 is not present as a film covering the entirety of the active region, but includes an opening. A part of the organic barrier layer 14 other than the opening, namely, a part actually formed of an organic film, will be referred to as a "solid portion". The "opening" (may be referred to also as a "non-solid portion") does not need to be enclosed by the solid portion, but may have a cutout or the like. In the opening, the first inorganic barrier layer 12 and the second inorganic barrier layer 16 are in direct contact with each other. The opening included in the organic barrier layer 14 includes at least an opening formed to enclose the active region, and the active region is fully enclosed by a portion where the first inorganic barrier layer 12 and the second inorganic barrier layer 16 are in direct contact with each other ("inorganic barrier layer junction portion"). A planar shape of the organic barrier layer 14 having such a structure is defined by a portion in which a region where a photocurable resin is present in a condensed state and a region selectively exposed to a laser beam (Irradiation region) overlap each other. Namely, even if the region where no photocurable resin is present is irradiated with a laser beam, the organic barrier layer 14 is not formed in such a region. Even in the region where the photocurable resin is present, the organic barrier layer 14 is not formed unless such a region is irradiated with a laser beam of a necessary radiation dose. In addition, the planar shape of the organic barrier layer 14 may be decreased in the size by ashing performed on the organic barrier layer 14 as necessary.

Embodiment 1

Figure 13:
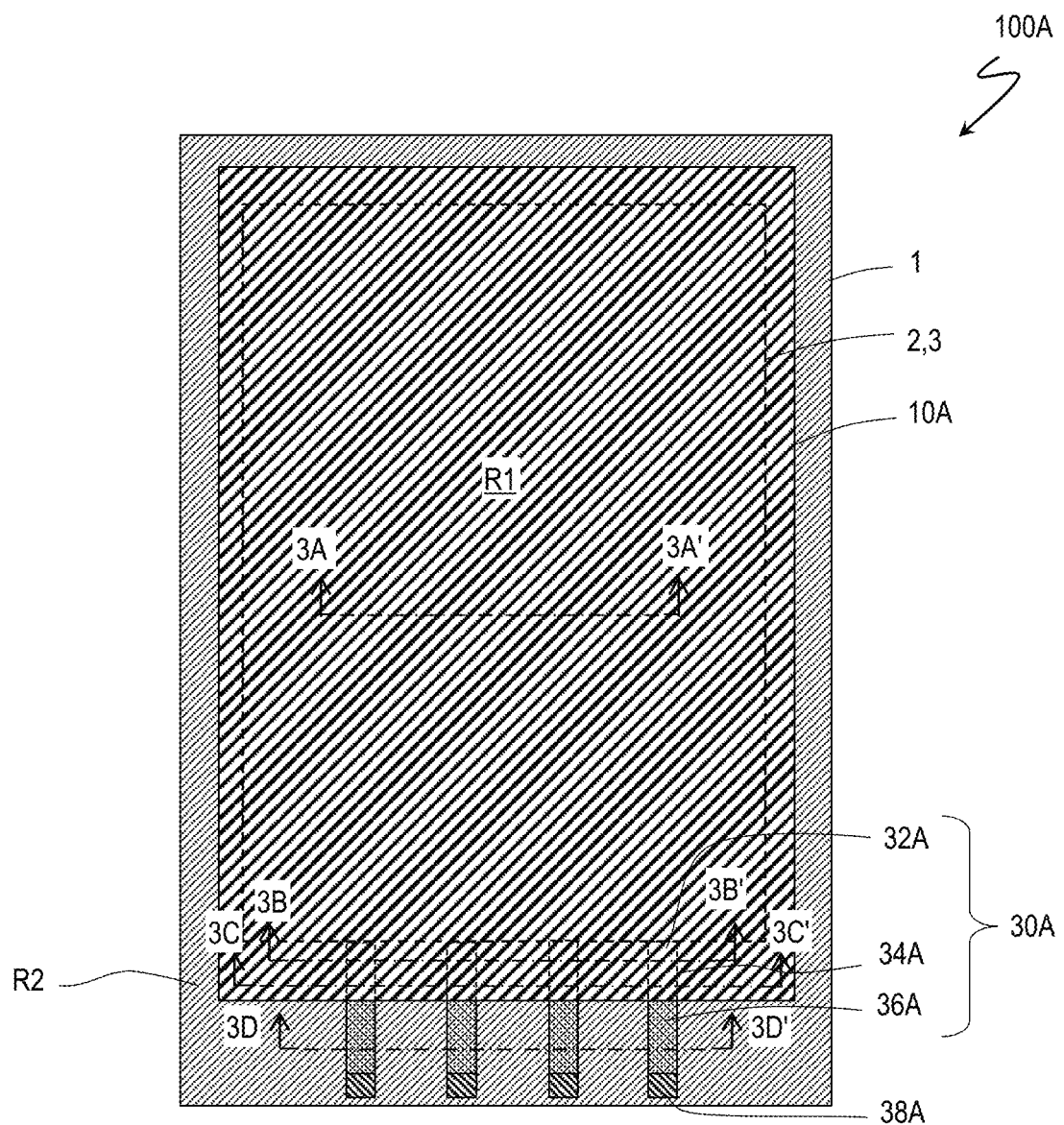
FIG. 13 is a schematic plan view showing a structure of an OLED display device 100A in embodiment 1 according to the present invention.
Figure 14:
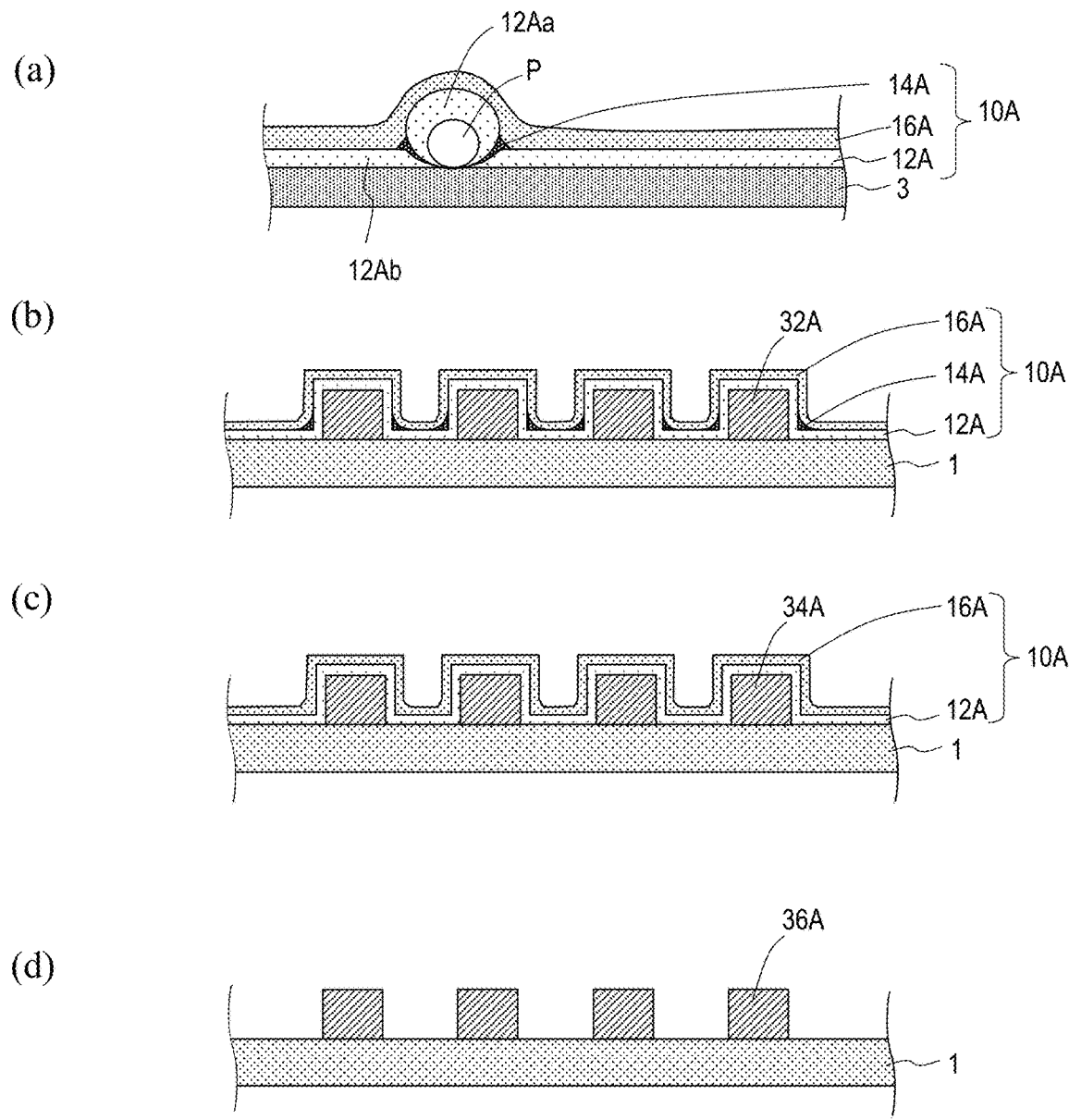
FIG. 14(a) through FIG. 14(d) are each a schematic cross-sectional view of the OLED display device 100A.
Figure 15:
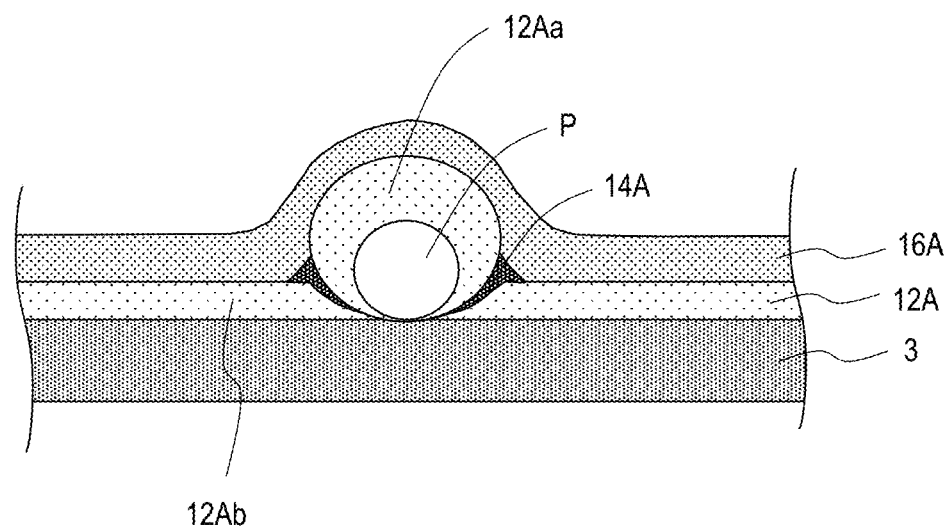
FIG. 15(a) is an enlarged view of a portion including a particle P in FIG. 14(a)
FIG. 15(b) is a schematic cross-sectional view of a first inorganic barrier layer (SiN layer) covering the particle P.
Figure 15:
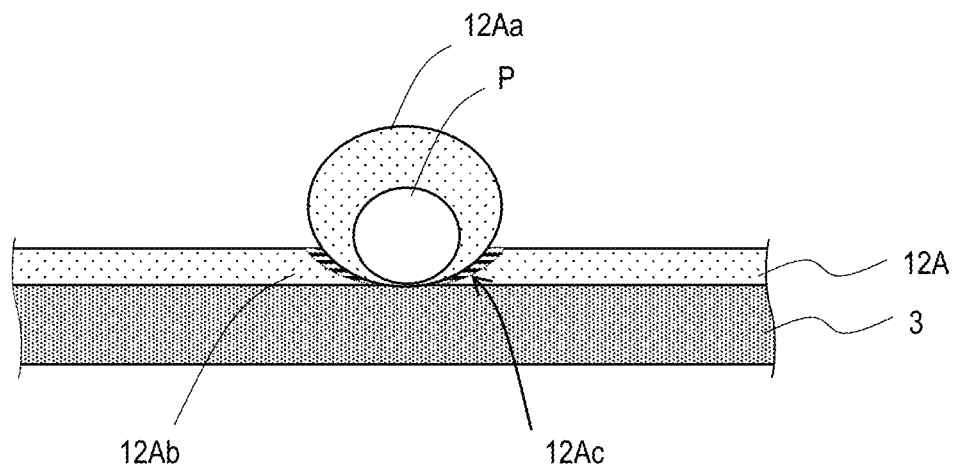

With reference to FIG. 13 through FIG. 15, a method for producing an OLED display device in embodiment 1 according to the present invention will be described.

FIG. 13 is a schematic plan view of an OLED display device 100A in embodiment 1 according to the present invention. The OLED display device 100A includes a flexible substrate 1, a circuit (back plane circuit) 2 formed on the flexible substrate 1, a plurality of OLEDs 3 formed on the circuit 2, and a TFE structure 10A formed on the OLEDs 3. A layer including an array of the plurality of OLEDs 3 may be referred to as an "OLED layer 3". The circuit 2 and the OLEDs 3 may share at least one component. An optional polarization plate (see reference numeral 4 in FIG. 12) may further be located on the TFE structure 10A. In addition, a layer having a touch panel function may be located between the TFE structure 10A and the polarization plate. Namely, the OLED display device 100A may be altered to a display device including an on-cell type touch panel.

The circuit 2 includes a plurality of TFTs (not shown), and a plurality of gate bus lines (not shown) and a plurality of source bus lines (not shown) each connected to either one of the plurality of TFTs (not shown). The circuit 2 may be a known circuit that drives the plurality of OLEDs 3. The plurality of OLEDs 3 are each connected with either one of the plurality of TFTs included in the circuit 2. The OLEDs 3 may be known OLEDs.

The OLED display device 100A further includes a plurality of terminals 38A located in a peripheral region R2 outer to the active region (region enclosed by the dashed line in FIG. 13) R1, where the plurality of OLEDs 3 are located, and a plurality of lead wires 30A connecting each of the plurality of terminals 38A and either one of the plurality of gate bus lines or either one of the plurality of source bus lines to each other. The TFE structure 10A is formed on the plurality of OLEDs 3 and on a part, of the plurality of lead wires 30A, that is in the active region R1. Namely, the TFE structure 10A covers the entirety of the active region R1 and is selectively formed on the part of the plurality of lead wires 30A that is in the active region R1. Neither a part, of the lead wires 30A, closer to the terminals 38A, nor the terminals 38A, are covered with the TFE structure 10A.

Hereinafter, an example in which the lead wires 30A and the terminals 38A are integrally formed in the same conductive layer will be described. Alternatively, the lead wires 30A and the terminals 38A may be formed in different conductive layers from each other (the lead wires 30A and the terminals 38A may have a stack structure).

Now, with reference to FIG. 14(a) through FIG. 14(d), the TFE structure 10A of the OLED display device 100A will be described. FIG. 14(a) shows a cross-section taken along line 3A-3A' in FIG. 13. FIG. 14(b) shows a cross-section taken along line 3B-3B' in FIG. 13. FIG. 14(a) shows a cross-section taken along line 3C-3C' in FIG. 13. FIG. 14(d) shows a cross-section taken along line 3D-3D' in FIG. 13. FIG. 14(d) is a cross-sectional view of a region where the TFE structure 10A is not formed.

As shown in FIG. 14(a), the TFE structure 10A includes a first inorganic barrier layer 12A formed on the OLEDs 3, an organic barrier layer 14A in contact with the first inorganic barrier layer 12A, and a second inorganic barrier layer 16A in contact with the organic barrier layer 14A. The first inorganic barrier layer 12A and the second inorganic barrier layer 16A are each, for example, an SiN layer, and are selectively formed in a predetermined region so as to cover the active region R1 by plasma CVD using a mask.

The organic barrier layer 14A may be formed by, for example, the method described in Patent Document 2. For example, a vapor-like or mist-like photocurable resin (e.g., an organic material such as acrylic monomer or the like) is supplied, in a chamber, onto an element substrate maintained at room temperature or a lower temperature. The photocurable resin is condensed on the element substrate and put into an liquid state. The photocurable resin in this state is allowed to be located locally, namely, at a border between a side surface of a protruding portion and a flat portion of the first inorganic barrier layer 12 by a capillary action or a surface tension of the photocurable resin. Then, a selected region of the photocurable resin is irradiated with, for example, an ultraviolet laser beam to be partially cured, so that a solid portion of the organic barrier layer (e.g., acrylic resin layer) 14A is formed at the border in the vicinity of the protruding portion in the selected region. The organic barrier layer 14A formed by this method substantially includes no solid portion in the flat portion. Regarding the method for forming the organic barrier layer, the disclosure of Patent Document 2 is incorporated herein by reference.

FIG. 14(a) is a cross-sectional view taken along line 3A-3A' in FIG. 13, and shows a portion including a particle P. The particle P is a microscopic dust particle generated during the production of the OLED display device, and is, for example, a microscopic piece of broken glass, a metal particle or an organic particle. Such a particle is especially easily generated in the case where mask vapor deposition is used.

As shown in FIG. 14(a), the organic barrier layer (solid portion) 14A may be formed only in the vicinity of the particle P. A reason for this is that the acrylic monomer supplied after the first inorganic barrier layer 12A is formed is condensed and present locally, namely, in the vicinity of a surface of the first inorganic barrier layer 12A on the particle P. There is the opening (non-solid portion) of the organic barrier layer 14A on the flat portion of the first inorganic barrier layer 12A.

Now, with reference to FIG. 15(a) and FIG. 15(b), a structure of the portion including the particle P will be described. FIG. 15(a) is an enlarged view of the portion including the particle P in FIG. 14(a), and FIG. 15(b) is a schematic cross-sectional view of the first inorganic barrier layer (e.g., SiN layer) covering the particle P.

As shown in FIG. 15(b), in the case where the particle P (having a diameter of, for example, 1 μm or longer) is present, the first inorganic barrier layer may have a crack (void) 12Ac. As described below, this is considered to be caused by impingement of an SiN layer 12Aa growing from a surface of the particle P and an SiN layer 12Ab growing from a flat portion of a surface of the OLED 3. In the case where such a crack 12Ac is present, the barrier property level of the TFE structure 10A is decreased.

As shown in FIG. 15(a), in the TFE structure 10A of the OLED display device 100A, the organic barrier layer 14A is formed to fill the crack 12Ac in the first inorganic barrier layer 12A, and a surface of the organic barrier layer 14A couples a surface of the first inorganic barrier layer 12Aa on the particle P and a surface of the first inorganic barrier layer 12Ab on the flat portion of the OLED 3 to each other continuously and smoothly. Therefore, the first inorganic barrier layer 12A on the particle P and the second inorganic barrier layer 16A formed on the organic barrier layer 14A have no void and are fine. As can be seen, even in the case where the particle is present, the organic barrier layer 14A retains the barrier property level of the TFE structure 10A.

Now, with reference to FIG. 14(b) and FIG. 14(c), a specific example of the TFE structure 10A on the lead wires 30A will be described. FIG. 14(b) is a cross-sectional view taken along line 3B-3B' in FIG. 13, and shows a cross-section of portions 32A of the lead wires 30A. The portions 32A of the lead wires 32 are located in the irradiation region to be irradiated with the laser beam. By contrast, FIG. 14(c) is a cross-sectional view taken along line 3C-3C' in FIG. 13, and shows a cross-section of portions 34A of the lead wires 30A. The portions 34A of the lead wires 30A are located outer to the irradiation region to be irradiated with the laser beam (located in the non-light exposure region).

The lead wires 30A are patterned in, for example, the process in which the gate bus lines or the source bus lines are patterned. Therefore, in this example, the gate bus lines and the source bus lines formed in the active region R1 have the same cross-sectional structure as that of the portions 32A and the portions 34A of the lead wires 30A. The cross-sectional shape of the lead wires 30A is not limited to the example shown in FIG. 14.

The OLED display device 100A in an embodiment according to the present invention is preferably usable for, for example, a small- or medium-sized high-definition smartphone or tablet terminal. For a small- or medium-sized (e.g., 5.7 inches) high-definition (e.g., 500 ppi) OLED display device, it is preferred that the wires (including the gate bus lines and the source bus lines) in the active region R1 have a cross-section of a shape close to a rectangle, in a direction parallel to the line width direction in order to have a sufficiently low resistance with a limited line width. In the meantime, the active region R1 of the OLED display device 100A is substantially enclosed by the inorganic barrier layer joint portion where the first inorganic barrier layer 12A and the second inorganic barrier layer 16A are in direct contact with each other. Therefore, the organic barrier layer 14A does not act as a route that guides moisture into the active region R1, and thus moisture does not enter the active region R1 of the OLED display device.

Referring to FIG. 14(b), the organic barrier layer (solid portion) 14 is present between the first inorganic barrier layer 12A and the second inorganic barrier layer 16A, at the side surface of each of the portions 32A of the lead wires 30A.

By contrast, referring to FIG. 14(c), at the side surface of each of the portions 34A of the lead wires 30A, the organic barrier layer (solid portion) 14 is not present, and the first inorganic barrier layer 12A and the second inorganic barrier layer 16A are in direct contact with each other (namely, the inorganic barrier layer joint portion is formed). On the flat portion, the organic barrier layer (solid portion) 14A is not formed. Therefore, in a cross-section taken along line 3C-3C' in FIG. 13, the lead wires 30A are covered with the inorganic barrier layer joint portion where the first inorganic barrier layer 12A and the second inorganic barrier layer 16A are in direct contact with each other.

For this reason, as described above, it does not occur that the organic barrier layer formed along the lead wires acts as a route that guides water vapor in the air into the active region. From the point of view of the moisture-resistance reliability, it is preferred that the length of the portions 34A of the lead wires 30A, namely, the size (width) of the inorganic barrier layer joint portion measured in a direction in which the lead wires 30A extend, is at least 0.01 mm. There is no specific upper limit on the width of the inorganic barrier layer joint portion. However, even if the width exceeds 0.1 mm, the effect of improving the moisture-resistance reliability is substantially saturated. A width longer than 0.1 mw merely increases the width of the frame portion. Therefore, the width is preferably 0.1 mm or shorter, and may be, for example, 0.05 mm or shorter. In a conventional TFE structure in which the organic barrier layer is formed by an inkjet method, an organic barrier layer joint portion having a width of about 0.5 mm to about 1.0 mm is provided in consideration of the variance in the position of an edge of the organic barrier layer. By contrast, in an embodiment according to the present invention, the width of the inorganic barrier layer joint portion may be 0.1 mm or shorter. This decreases the width of the frame portion of the organic EL display device.

Now, FIG. 14(d) will be referred to. FIG. 14(d) is a cross-sectional view of the region where the TFE structure 10A is not formed. Portions 36K of the lead wires 30A shown in FIG. 14(d) are located outer to the irradiation region to be irradiated with the laser beam (located in the non-light exposure region). Therefore, the organic barrier layer 14A is not formed on a lowest portion of a side surface of each of the portions 36A. Thus, the organic barrier layer (solid portion) 14A is not present on a side surface of the portions 34A of the lead wires 30A or a side surface of the terminals 38A. The organic barrier layer 14A is not present on the flat portion, either.

As described above, the formation of the organic barrier layer 14A includes a step of supplying a vapor-like or mist-like photocurable resin (e.g., acrylic monomer). Therefore, the photocurable resin is not allowed to be selectively condensed only in a predetermined region, unlike the first inorganic barrier layer 12A or the second inorganic barrier layer 16A. For this reason, with a conventional method of exposing the entire surface of the substrate to ultraviolet rays, the organic barrier layer (solid portion) 14A may be formed also in a region where the organic barrier layer (solid portion) 14A is not necessary. By contrast, in this embodiment, a plurality of selected regions are irradiated with a laser beam. This suppresses formation of the organic barrier layer (solid portion) 14A in stepped portions caused by the lead wires.

Figure 16A:
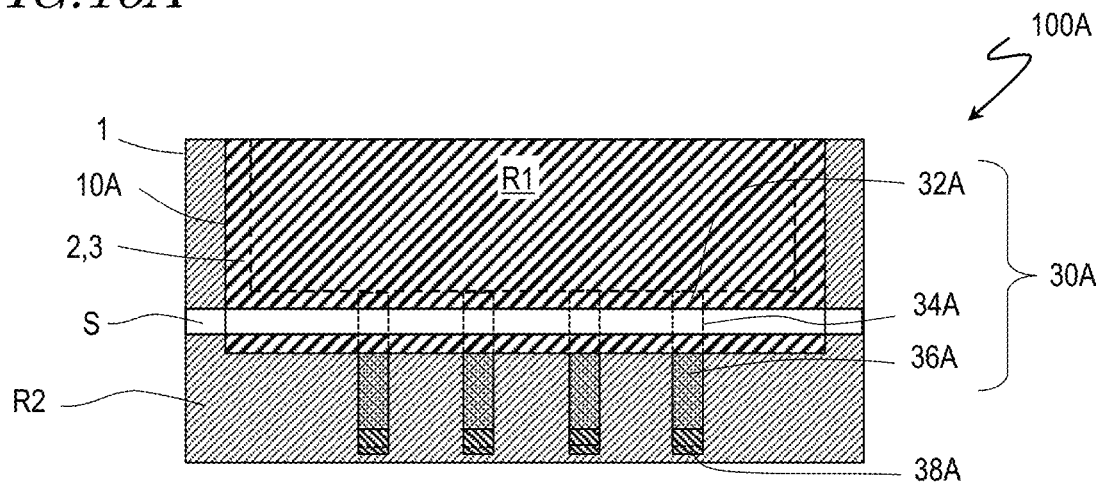
FIG. 16A shows an example of "non-light exposure region S", in which an inorganic barrier layer joint portion crossing lead wires 30A is to be formed.
Figure 16B:
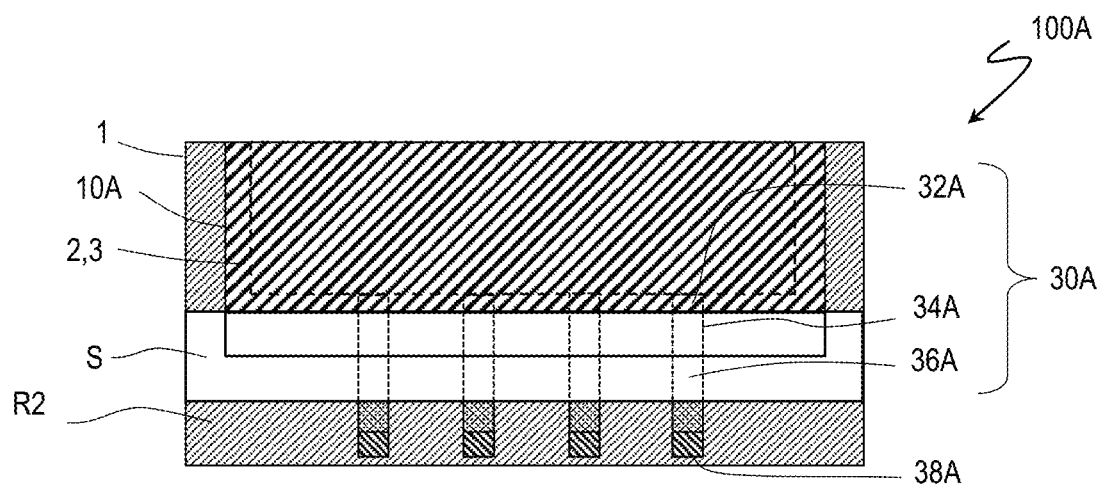
FIG. 16B shows another example of "non-light exposure region S", in which the inorganic barrier layer joint portion crossing lead wires 30A is to be formed.
Figure 16C:
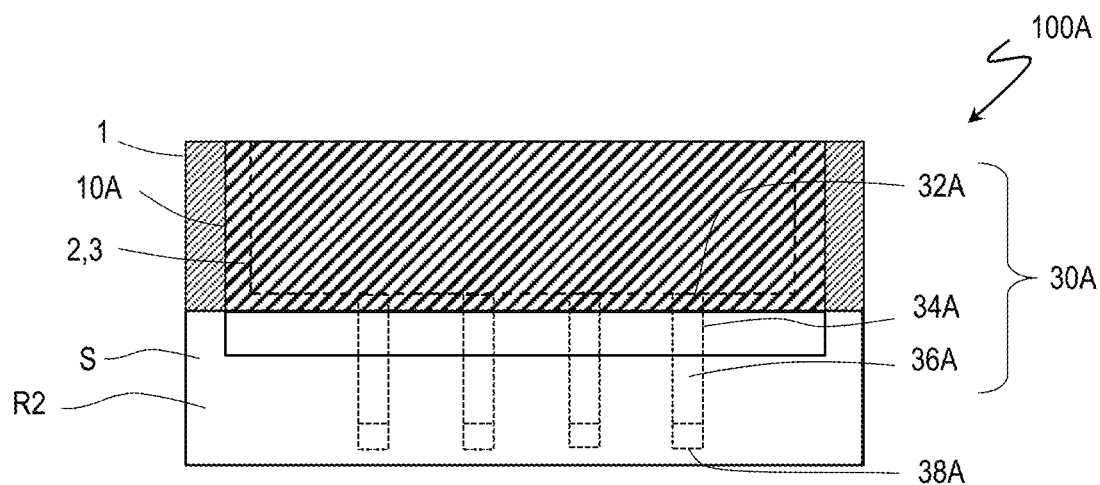
FIG. 16C shows still another example of "non-light exposure region S", in which the inorganic barrier layer joint portion crossing lead wires 30A is to be formed.

FIG. 16A, FIG. 16B and FIG. 16C each show an example of "non-light exposure region S", in which the inorganic barrier layer joint portion crossing the lead wires 30A is to be formed. In each of these figures, the white region is the "non-light exposure region S". The non-light exposure region S extending like a slit merely needs to cross the lead wires 30A completely, but does not need to cover the entirety of the lead wires 30A. The shape and the size of the non-light exposure region S are not limited to those shown here. The non-light exposure region S may have any of various shapes and any of various sizes with which a moisture entrance route provided by the organic barrier layer 14A, which may be formed along the lead wires 30A, is blocked.

Figure 17:
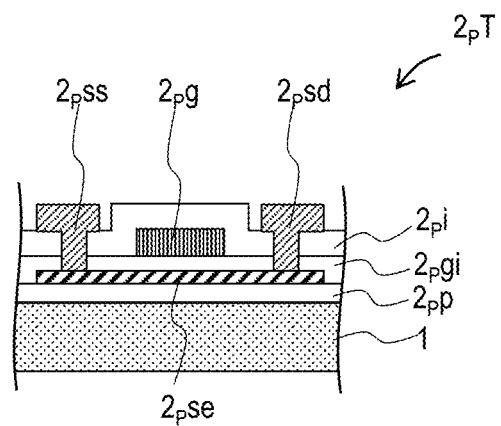
FIG. 17(a) and FIG. 17(b) are each a schematic cross-sectional view showing an example of TFT that may be included in the OLED display device in embodiment 1 according to the present invention.
Figure 17:
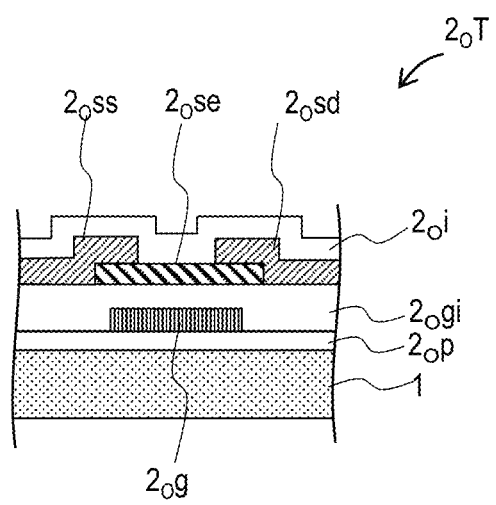

Now, with reference to FIG. 17, an example of TFT usable in the OLED display device 100A, and an example of lead wire and an example of terminal formed by use of a gate metal layer and a source metal layer used to form the formation of the TFT, will be described.

For a small- or medium-sized high-definition OLED display device, a low temperature polycrystalline silicon (referred to simply as "LTPS") TFT or an oxide TFT (e.g., four-component-based (In—Ga—Zn—O-based) oxide TFT containing In (indium), Ga (gallium), Zn (zinc) and O (oxygen)), which has a high mobility, is preferably used. Structures of, and methods for producing, the LTPS-TFT and the In—Ga—Zn—O-based TFT are well known and will be merely briefly described below.

FIG. 17(a) is a schematic cross-sectional view of an LTPS-TFT $2_pT$. The TFT $2_pT$ may be included in the circuit 2 of the OLED display device 100A. The LTPS-TFT $2_pT$ is a top gate-type TFT.

The TFT $2_pT$ is formed on a base coat $2_pp$ on the substrate 1 (e.g., polyimide film). Although not described above, it is preferred that a base coat formed of an inorganic insulating material is formed on the substrate 1.

The TFT $2_pT$ includes a polycrystalline silicon layer $2_p$se formed on the base coat $2_p$p, a gate insulating layer $2_p$gi formed on the polycrystalline silicon layer $2_p$se, a gate electrode $2_p$g formed on the gate insulating layer $2_p$gi, an interlayer insulating layer $2_p$i formed on the gate electrode $2_p$g, and a source electrode $2_p$ss and a drain electrode $2_p$sd formed on the interlayer insulating layer $2_p$i. The source electrode $2_p$ss and the drain electrode $2_p$sd are respectively connected with a source region and a drain region of the polycrystalline silicon layer $2_p$se in contact holes formed in the interlayer insulating layer $2_p$i and the gate insulating layer $2_p$gi.

The gate electrode $2_p$g is contained in the gate metal layer containing the gate bus lines, and the source electrode $2_p$ss and the drain electrode $2_p$sd are contained in the source metal layer containing the source bus lines. The gate metal layer and the source metal layer are used to form the lead wire and the terminal.

The TFT $2_pT$ is formed, for example, as follows.

As the substrate 1, for example, a polyimide film having a thickness of 15 µm is prepared.

The base coat $2_p$p (SiO$_2$ film: 250 nm/SiN film: 50 nm/SiO$_2$ film: 500 nm (top layer/middle layer/bottom layer)) and an a-Si film (40 nm) are formed by plasma CVD.

The a-Si film is subjected to dehydrogenation (e.g., annealed at 450° C. for 180 minutes).

The a-Si film is crystallized to form a polycrystalline-silicon by excimer laser annealing (ELA).

The a-Si film is patterned by a photolithography step to form an active layer (semiconductor island).

A gate insulating film (SiO$_2$ film: 50 nm) is formed by plasma CVD.

A channel region of the active layer is doped with (B').

The gate metal layer (Mo: 250 nm) is formed by sputtering and patterned by a photolithography step (including a dry etching step) (to form the gate electrode $2_p$g, the gate bus lines, and the like).

A source region and a drain region of the active layer are doped with (P*).

Activation annealing (e.g., annealing at 450° C. for 45 minutes) is performed. As a result, the polycrystalline silicon layer $2_p$se is formed.

An interlayer insulating film (e.g., SiO$_2$ film: 300 nm/SiN$_x$ film: 300 nm (top layer/bottom layer)) is formed by plasma CVD.

The contact holes are formed in the gate insulating film and the interlayer insulating film by dry etching. As a result, the interlayer insulating layer $2_p$i and the gate insulating layer $2_p$gi are formed.

The source metal layer (Ti film: 100 nm/Al film: 300 nm/Ti film: 30 nm) is formed by sputtering and patterned by a photolithography step (including a dry etching step) (to form the source electrode $2_p$ss, the drain electrode $2_p$sd, the source bus lines, and the like).

FIG. 17(b) is a schematic cross-sectional view of an In—Ga—Zn—O-based TFT $2_oT$. The TFT $2_oT$ may be included in the circuit 2 of the OLED display device 100A. The TFT $2_oT$ is a bottom gate-type TFT.

The TFT $2_oT$ is formed on a base coat $2_o$p on the substrate 1 (e.g., polyimide film). The TFT $2_oT$ includes a gate electrode $2_o$g formed on the base coat $2_o$p, a gate insulating layer $2_o$gi formed on the gate electrode $2_o$g, an oxide semiconductor layer $2_o$se formed on the gate insulating layer $2_o$gi, and a source electrode $2_o$ss and a drain electrode $2_o$sd respectively formed on a source region and a drain region of the oxide semiconductor layer $2_o$se. The source electrode $2_o$ss and the drain electrode $2_o$sd are covered with an interlayer insulating layer $2_o$i.

The gate electrode $2_o$g is contained in the gate metal layer containing the gate bus lines, and the source electrode $2_o$ss and the drain electrode $2_o$sd are contained in the source metal layer containing the source bus lines. The gate metal layer and the source metal layer may be used to form the lead wire and the terminal.

The TFT $2_oT$ is formed, for example, as follows.

As the substrate 1, for example, a polyimide film having a thickness of 15 µm is prepared.

The base coat $2_o$p (SiO$_2$ film: 250 nm/SiN$_x$ film: 50 nm/SiO$_2$ film: 500 nm (top layer/middle layer/bottom layer)) is formed by plasma CVD.

The gate metal layer (Cu film: 300 nm/Ti film: 30 nm (top layer/bottom layer)) is formed by sputtering and patterned by a photolithography step (including a dry etching step) (to form the gate electrode $2_o$g the gate bus lines, and the like).

A gate insulating film (SiO$_2$ film: 30 nm/SiN$_x$ film: 350 nm (top layer/bottom layer)) is formed by plasma CVD.

An oxide semiconductor film (In—Ga—Z—O-based semiconductor film: 100 nm) is formed by sputtering and patterned by a photolithography step (including a wet etching step) to form an active layer (semiconductor island).

The source metal layer (Ti film: 100 nm/Al film: 300 nm/Ti film: 30 nm (top layer/medium layer/bottom layer)) is formed by sputtering and patterned by a photolithography step (including a dry etching step) (to form the source electrode $2_o$ss, the drain electrode $2_o$sd, the source bus lines, and the like).

Activation annealing (e.g., annealing at 300° C. for 120 minutes) is performed. As a result, the oxide semiconductor layer $2_o$se is formed.

After this, the interlayer insulating layer $2_o$i (e.g., SiN$_x$ film: 300 nm/SiO$_2$ film: 300 nm (top layer/bottom layer)) is formed by plasma CVD as a protective film.

Embodiment 2

In the formation of the organic barrier layer 14A described in embodiment 1, a photocurable resin such as an acrylic monomer or the like is located locally, namely, in a stepped portion. A method for producing an OLED display device in embodiment 2 described below includes a step of forming a resin layer (e.g., acrylic resin layer) also on at least a part of the flat portion and partially ashing the resin layer to form an organic barrier layer. First, the thickness of the resin layer to be formed is adjusted (to, for example, less than 100 nm), the irradiation region to be irradiated with the laser beam is selected, and/or ashing conditions (including time) are adjusted. In this manner, an organic barrier layer of any of various forms may be formed. Namely, the organic barrier layer 14A included in the OLED display device 100A described in embodiment 1 may be formed, or an organic barrier layer (solid portion) substantially covering a part of, or the entirety of, the flat portion may be formed. In the case where the organic barrier layer has a large area size, an effect of improving a bending resistance is provided. In the following, an OLED display device including a TFE structure that includes an organic barrier layer (solid portion) covering a part of, or the entirety of, a flat portion, and a method for producing the same, will be mainly described. The structure of the element substrate before the TFE structure is formed, especially, the structures of the lead wires and the terminals and the structure of the TFT, may be any of the structures described in embodiment 1.

Figure 18:
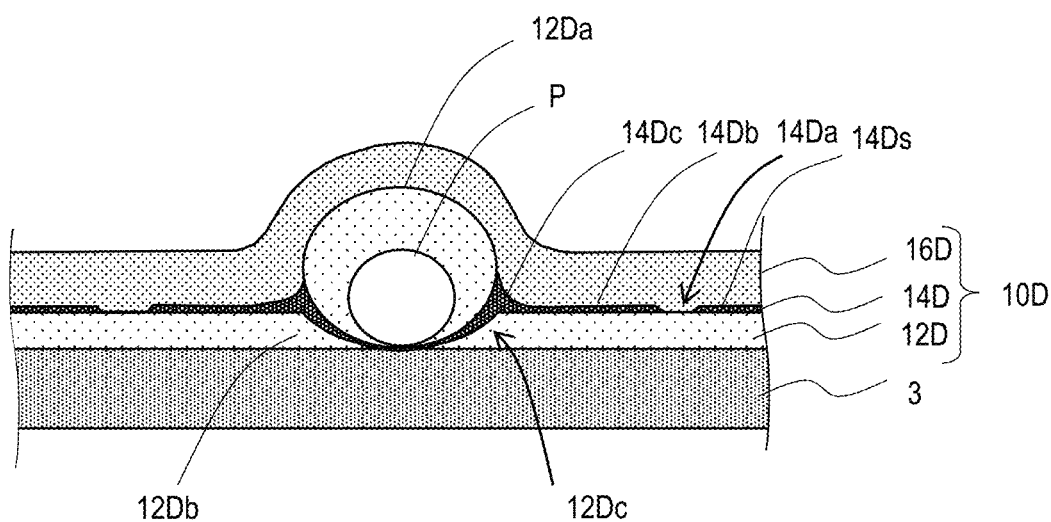
FIG. 18 provides schematic partial cross-sectional views of a TFE structure 10 in an OLED display device in embodiment 2 according to the present invention.
Figure 18:
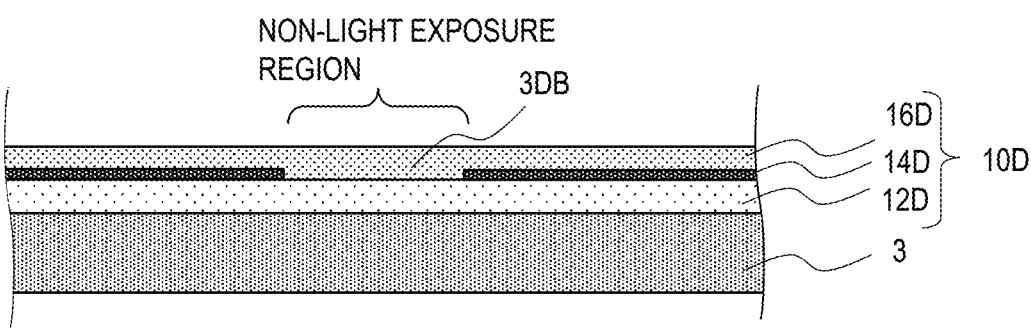
Figure 19:
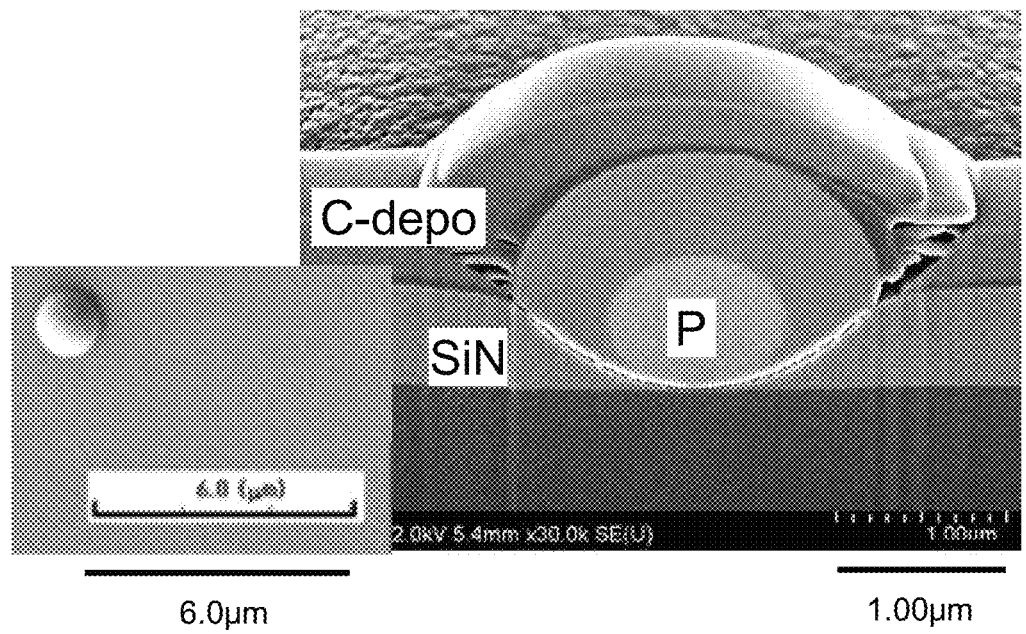
FIG. 19 shows a cross-sectional SEM image of a first inorganic barrier layer (SiN layer) covering a particle (silica sphere having a diameter of 1 μm) and also shows a planar SEM image thereof (bottom left).

FIG. 18(a) is a schematic partial cross-sectional view of a TFE structure 10D in an OLED display device in embodiment 2 according to the present invention, and shows a portion including a particle P. As described above with reference to FIG. 15(b), in the case where the particle P is present, a first inorganic barrier layer 12D may have a crack (void) 12Dc. Based on a cross-sectional SEM image shown in FIG. 19, this is considered to be caused by impingement of an SiN layer 12Da growing from a surface of the particle P and an SiN layer 12Db growing from a flat portion of a surface of the OLED 3. In the case where such a crack 12Dc is present, the barrier property level of the TFE structure 10D is decreased. The SEM image shown in FIG. 19 is of a sample formed as follows. In a state where a silica sphere having a diameter of 1 μm as the particle P is located on a glass substrate, an SiN film is formed by plasma CVD. The cross-section shown here is not taken along a plane passing the center of the particle P. An outermost surface of the sphere is a carbon layer (C-depo) provided for protection at the time of processing the cross-section. As can be seen, even the presence of a relatively small silica sphere having a diameter of 1 μm causes the crack (void) 12Dc in the SiN layer 12D.

Figure 20:
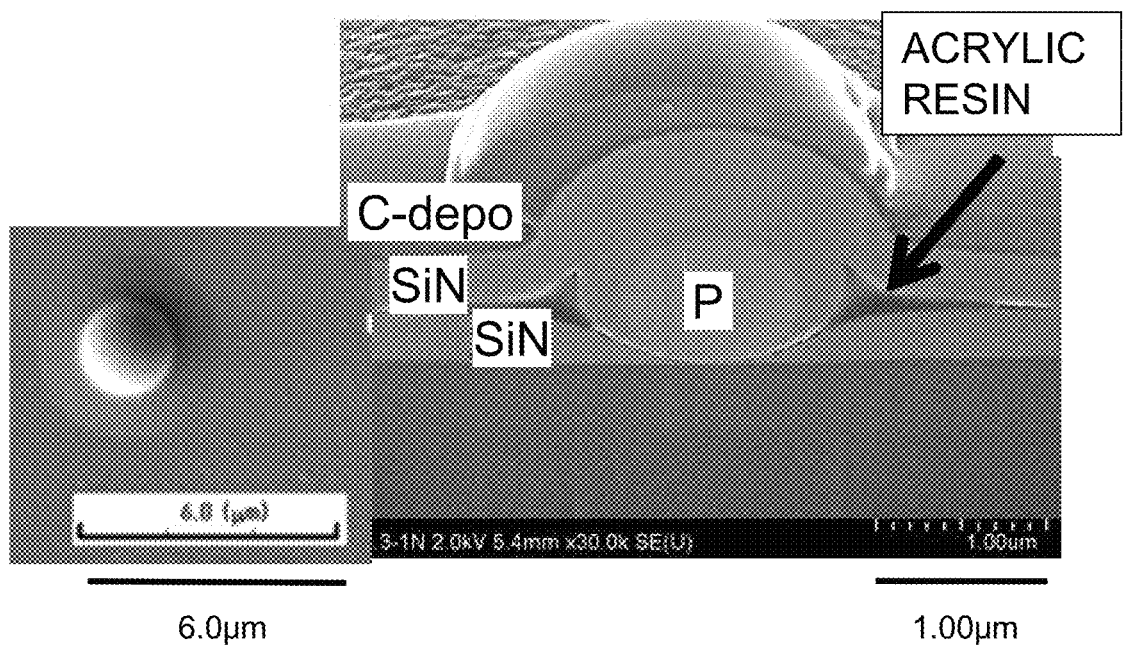
FIG. 20 shows a cross-sectional SEM image of a TFE structure covering a particle (silica sphere having a diameter of 2.15 μm) and also shows a planar SEM image thereof (bottom left).

In the TFE structure 10D of the OLED display device in embodiment 2, as shown in FIG. 18(a), an organic barrier layer 14Dc is formed to fill the crack 12Dc in the first inorganic barrier layer 12D and a portion overhanging the particle P. Therefore, the barrier property level is retained by a second inorganic barrier layer 16D. This is confirmed by a cross-sectional SEM image shown in FIG. 20. In FIG. 20, no interface appears in a portion where the second inorganic barrier layer 16D is formed directly on the first inorganic barrier layer 12D. However, in the schematic view, the first inorganic barrier layer 12D and the second inorganic barrier layer 16D are shown with different patterns of hatching for clear illustration.

The cross-sectional SEM image shown in FIG. 20 is of a sample formed as follows. In a state where a silica sphere having a diameter of 2.15 μm is located on a glass substrate like in the case of the cross-sectional SEM image shown in FIG. 19, the TFE structure 10D is formed. As can be seen from a comparison between FIG. 20 and FIG. 19, although the diameter of the particle P shown in FIG. 20 is about twice the diameter of the particle P shown in FIG. 19, the SiN film formed on the acrylic resin layer is fine with no void. Separately, another sample formed as follows is observed. Like in the case of FIG. 19, an SiN film is formed by plasma CVD so as to cover particles P (silica spheres having diameters of 2.15 μm and 4.6 μm), an acrylic resin layer is formed as the organic barrier layer 14D, and then another SiN film is formed by plasma CVD. With this sample also, it has been confirmed by an SEM observation that the SiN film formed on the acrylic resin layer is fine with no void.

As described below, the organic barrier layer 14D shown in FIG. 18(a) is formed of, for example, an acrylic resin. A film formed by curing, with light (e.g., ultraviolet rays), an acrylic monomer (acrylate) having a viscosity of about 1 to about 100 mPa·s at room temperature (e.g., 25° C.) is especially preferable. An acrylic monomer having such a low viscosity easily permeates the crack 12Dc and the portion overhanging the particle P. An acrylic resin has a high visible light transmittance and thus is preferably used for an OLED display device of a top emission type. The acrylic monomer is mixed with a photoinitiator as necessary. The photosensitive wavelength is adjustable in accordance with the type of the photoinitiator. Instead of the acrylic monomer, another photocurable resin is usable. A preferable photocurable resin is an ultraviolet-curable resin from the point of view of the reactivity or the like. A preferable laser beam to be used to irradiate the acrylic monomer has a wavelength in a UV-A region, namely, a wavelength of 315 nm or longer and 400 nm or shorter, among wavelengths in a near ultraviolet region (200 nm or longer and 400 nm or shorter). Alternatively, a laser beam having a wavelength of 300 nm or longer and shorter than 315 nm may be used. Still alternatively, a photocurable resin that is cured when being irradiated with a visible light laser beam in a range of bluish purple to blue having a wavelength of 400 nm or longer and 450 nm or shorter may be used.

A surface of the organic barrier layer 14Dc filing the crack 12Dc and the portion overhanging the particle P couples a surface of the first inorganic barrier layer 12Da on the particle P and a surface of an organic barrier layer 14Db formed on the flat portion of the surface of the OLED 3 to each other continuously and smoothly. Therefore, the second inorganic barrier layer 16D formed on the first inorganic barrier layer 12D on the particle P and on the organic barrier layer 14D is fine with no void.

A surface 14Ds of the organic barrier layer 14D is oxidized by ashing, and thus is hydrophilic and highly adhesive with the second inorganic barrier layer 16D.

In order to improve the bending resistance, it is preferred that the organic barrier layer 14D is ashed so as to remain on substantially the entire surface of the first inorganic barrier layer 12D except for the first inorganic barrier layer 12Da, namely, the protruding portion formed on the particle P. It is preferred that the organic barrier layer 14Db on the flat portion has a thickness of 10 nm or greater.

Patent Documents 2 and 3 each describe a structure in which an organic barrier layer is locally located. As a result of various experiments performed by the present inventor, it has been found that the organic barrier layer 14D may be formed on substantially the entirety of the flat portion of the first inorganic barrier layer 12D, namely, on substantially the entire surface of the first inorganic barrier layer 12D except for the first inorganic barrier layer 12Da, namely, the protruding portion. It is preferred from the point view of the bending resistance that the organic barrier layer 14D has a thickness of 10 nm or greater.

The organic barrier layer 14D provided between the first inorganic barrier layer 12D and the second inorganic barrier layer 16D improves the adhesiveness between the layers in the TFE structure 10D. Especially, the surface of the organic barrier layer 14D is oxidized and thus is highly adhesive with the second inorganic barrier layer 16D.

In the case where the organic barrier layer 14Db is formed on the entirety of the flat portion (i.e., in the case where the organic barrier layer 14D does not include an opening 14Da), when an external force is applied to the OLED display device, the stress (or the strain) caused in the TFE structure 10D is uniformly dispersed. As a result, breakage (especially, breakage of the first inorganic barrier layer 12D and/or the second inorganic barrier layer 16D) is suppressed. The organic barrier layer 14D present substantially uniformly while being in close contact with the first inorganic barrier layer 12D and the second inorganic barrier layer 16D is considered to act to disperse and alleviate the stress. As can be seen, the organic barrier layer 14D also provides an effect of improving the bending resistance of the OLED display device.

It should be noted that in the case where the organic barrier layer 14D has a thickness of 200 nm or greater, the bending resistance may be decreased. Therefore, it is preferred that the thickness of the organic barrier layer 14D is less than 200 nm.

The formation of the organic barrier layer 14D is completed after ashing. Ashing may be performed non-uniformly in the plane; specifically, a part of the organic barrier layer 14Db formed on the flat portion may be removed in the entire thickness thereof to expose the surface of the first inorganic barrier layer 12D. In this step, the organic barrier layer 14D is controlled such that the organic barrier layer (solid portion) 14Db formed on the flat portion of the OLED 3, among various parts of the organic barrier layer 14D, has an area size larger than that of the opening 14Da. Namely, the organic barrier layer 14D is controlled such that the solid portion 14Db has an area size that exceeds 50% of the area size of the organic barrier layer (including the opening) 14D on the flat portion. It is preferred that the area size of the solid portion 14Db is 80% or larger of the area size of the organic barrier layer 14D on the flat portion. Nonetheless, it is preferred that the area size of the solid portion 14Db does not exceed about 90% of the area size of the organic barrier layer on the flat portion. In other words, it is preferred that the organic barrier layer 14D on the flat portion includes the opening 14Da having an area size in total of about 10% of the area size thereof. The opening 14Da provides an effect of suppressing the first inorganic barrier layer 12D and the organic barrier layer 14D from being delaminated from each other at the interface thereof and of suppressing the organic barrier layer 14D and the second inorganic barrier layer 16D from being delaminated from each other at the interface thereof. In the case where the area size of the opening 14Da is 80% or larger and 90% or smaller of the area size of the organic barrier layer 14D on the flat portion, an especially high bending resistance is provided.

In the case where the organic barrier layer 14D is formed on the entirety of the flat portion, the organic barrier layer 14D on the flat portion acts as a route by which moisture enters the inside of the OLED display device, which declines the moisture-resistance reliability of the OLED display device. In order to prevent this, as shown in FIG. 18(b), the OLED display device in embodiment 2 includes an inorganic barrier layer joint portion 3DB substantially enclosing the active region. The inorganic barrier layer joint portion 3DB is defined by the non-light exposure region not to be irradiated with the laser beam.

In the inorganic barrier layer joint portion 3DB, the photocurable resin that is present in a pre-light exposure stage is not irradiated with the laser beam, and thus is not cured and selectively removed. Therefore, in the inorganic barrier layer joint portion 3DB, the opening 14Da of the organic barrier layer 14D is present but the solid portion 14Db is not present. Namely, in the inorganic barrier layer joint portion 3DB, the first inorganic barrier layer 12D and the second inorganic barrier layer 16D are in direct contact with each other. The OLED display device in embodiment 2 includes the organic barrier layer 14D on the flat portion, but the active region is fully enclosed by the inorganic barrier layer joint portion 3DB. Therefore, the OLED display device has a high level of moisture-resistance reliability.

Figure 21:
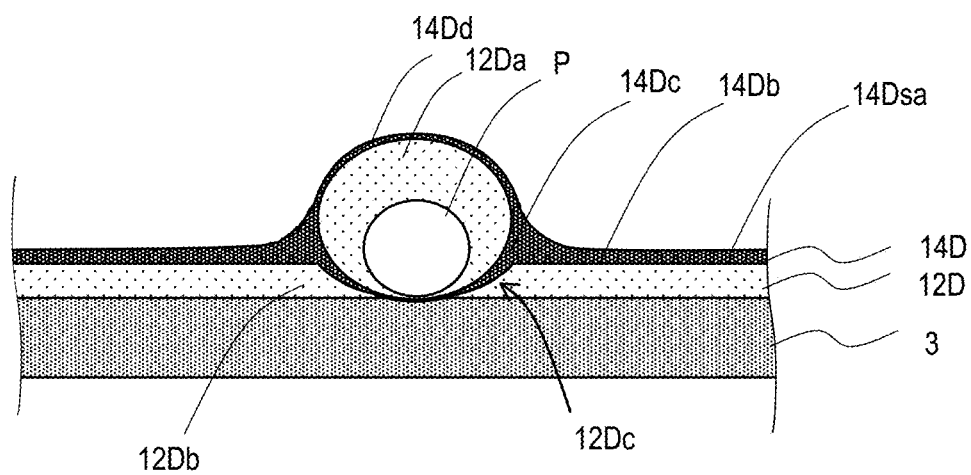
FIG. 21(a) through FIG. 21(c) are each a schematic cross-sectional view showing a step of forming the organic barrier layer 14D.
Figure 21:
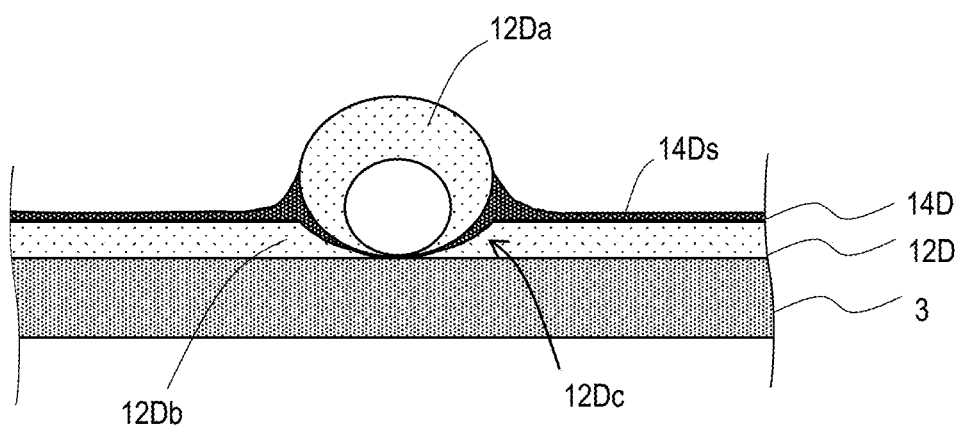
Figure 21:
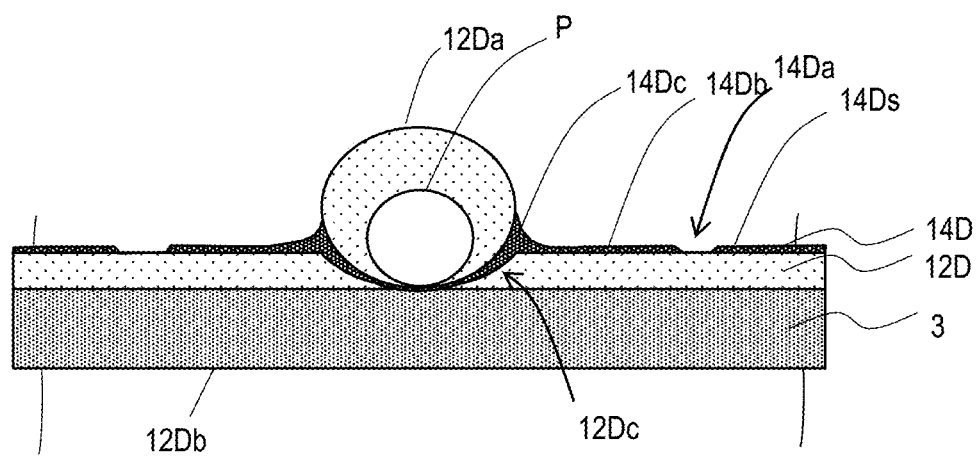
Figure 22:
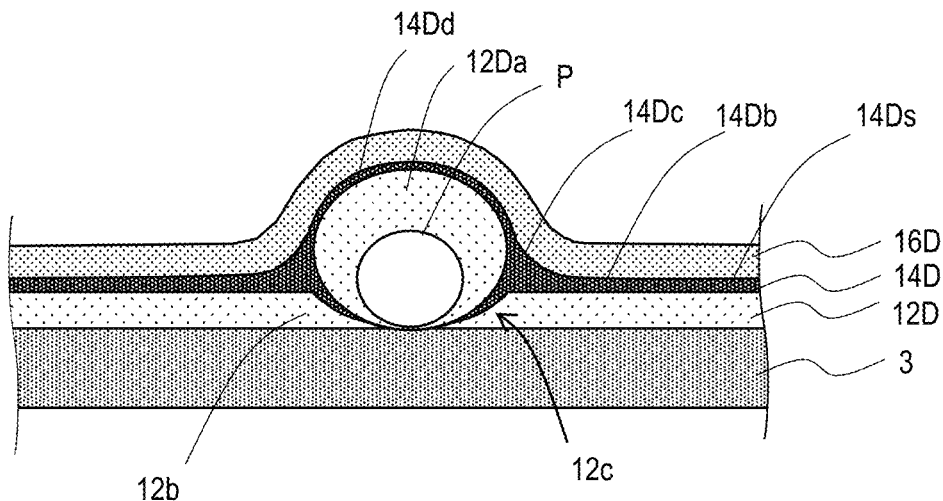
FIG. 22(a) through FIG. 22(a) are each a schematic cross-sectional view showing a step of forming a second inorganic barrier layer 16D.
Figure 22:
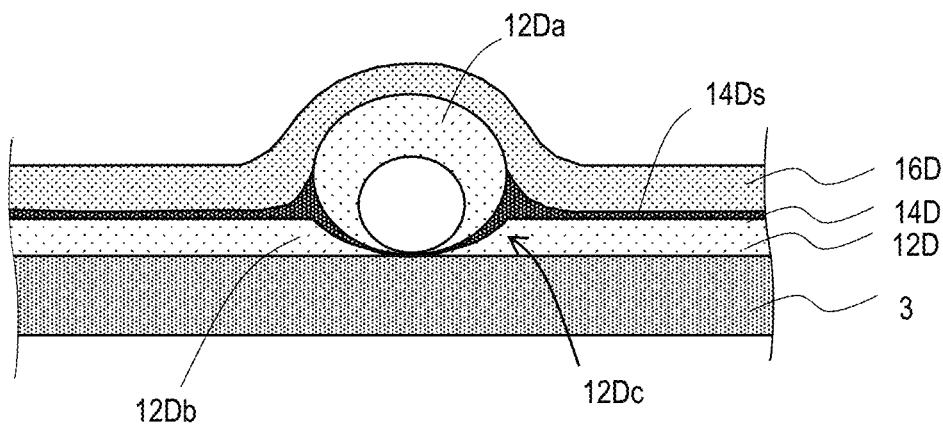
Figure 22:
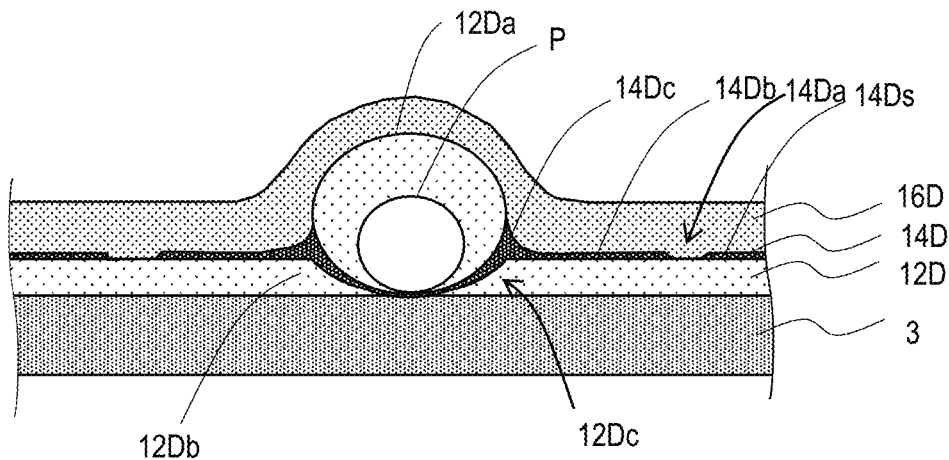

With reference to FIG. 21 and FIG. 22, a step of forming the organic barrier layer 14D and the second inorganic barrier layer 16D, especially, a step of ashing, will be described. FIG. 21 shows a step of forming the organic barrier layer 14D, and FIG. 22 shows a step of forming the second inorganic barrier layer 16D.

As schematically shown in FIG. 21(a), the first inorganic barrier layer 12D covering the particle P on the surface of the OLED 3 is formed, and then the organic barrier layer 14D is formed on the first inorganic barrier layer 12D. The organic barrier layer 14D is formed, for example, as follows. A vapor-like or mist-like acrylic monomer is condensed on a cooled element substrate, and then is irradiated with light (e.g., ultraviolet rays) to be cured. An acrylic monomer having a low viscosity may be used, so that the acrylic monomer permeates the crack 12Dc formed in the first inorganic barrier layer 12D.

In the example shown in FIG. 21(a), an organic barrier layer 14Dd is formed on the first inorganic barrier layer 12Da on the particle P. However, depending on the size or the shape of the particle P or the type of the acrylic monomer, the acrylic monomer may not be deposited (or attached) on the first inorganic barrier layer 12Da on the particle P, or may be deposited (or attached) merely in trace amount. The organic barrier layer 14D may be formed by use of, for example, the film deposition apparatus 200. The organic barrier layer 14D is adjusted to have an initial thickness of 100 nm or greater and 500 nm or less on the flat portion. Immediately after being formed, the organic barrier layer 14D has a surface 14Dsa that is smoothly continuous and hydrophobic. For the sake of simplicity, the organic barrier layer before the ashing bears the same reference sign.

Next, as shown in FIG. 21(b), the organic barrier layer 14D is ashed. The ashing may be performed by use of a known plasma ashing device, a known photoexcitation ashing device, or a known UV ozone ashing device. For example, plasma ashing using at least one type of gas among $N_2O$, $O_2$ and $O_3$, or a combination of such plasma ashing and ultraviolet ray irradiation, may be performed. In the case where an SiN film is formed by CVD as the first inorganic barrier layer 12D and the second inorganic barrier layer 16D, $N_2O$ is used as a material gas. Therefore, use of $N_2O$ for the ashing provides an advantage that the device is simplified.

In the case where the ashing is performed, the surface 14Ds of the organic barrier layer 14D is oxidized and thus is modified to be hydrophilic. In addition, the surface 14D of the organic barrier layer 14 is shaved almost uniformly and extremely tiny concaved and convexed portions are formed, and thus the surface area size of the surface 14Ds is enlarged. The effect of enlarging the surface area size provided by the ashing is greater for the surface of the organic barrier layer 14D than for the first inorganic barrier layer 12D formed of an inorganic material. Since the surface 14Ds of the organic barrier layer 14D is modified to be hydrophilic and the surface area size of the surface 14Ds is enlarged, the adhesiveness of the organic barrier layer 14D with the second inorganic barrier layer 16D is improved.

As the ashing is continued, as shown in FIG. 21(c), the opening 14Da is formed in a part of the organic barrier layer 14D.

As the ashing is still continued, as the organic barrier layer 14 shown in FIG. 15(a), the organic barrier layer 14Dc is left only in the crack 12Dc in the first inorganic barrier layer 12D and in the vicinity of the portion overhanging the particle P. In this state, the surface of the organic barrier layer 14Dc couples a surface of the first inorganic barrier layer 12Da on the particle P and the surface of the flat portion of the OLED 3 to each other continuously and smoothly.

In order to improve the adhesiveness between the first inorganic barrier layer 12D and the organic barrier layer 14D, the surface of the first inorganic barrier layer 12D may be ashed before the organic barrier layer 14D is formed.

Now, with reference to FIG. 22, a structure obtained after the second inorganic barrier layer 16D is formed on the organic barrier layer 14D will be described.

FIG. 22(a) schematically shows a structure obtained after the surface 14Dsa of the organic barrier layer 14D shown in FIG. 21(a) is ashed to be oxidized and modified to the hydrophilic surface 14Ds and then the second inorganic barrier layer 16D is formed. In this example, the surface 14Dsa of the organic barrier layer 14D is slightly ashed, and thus an organic barrier layer 14Dd remains on the first inorganic barrier layer 12Da on the particle P. Alternatively, there may be a case where the organic barrier layer 14D is not formed (or does not remain) on the first inorganic barrier layer 12Da on the particle P.

As shown in FIG. 22(a), the second inorganic barrier layer 16D formed on the organic barrier layer 14D has no void and has a high adhesiveness with the organic barrier layer 14D.

As shown in FIG. 22(b) and FIG. 22(c), the second inorganic barrier layer 16D formed on the organic barrier layer 14D shown in FIG. 21(b) and FIG. 21(a), each have no void and have a high adhesiveness with the organic barrier layer 14D. Even if the organic barrier layer 14D on the flat portion of the OLED 3 is completely removed, as long as the surface of the organic barrier layer 14Dc couples the surface of the first inorganic barrier layer 12Da on the particle P and the surface of the flat portion of the OLED 3 to each other continuously and smoothly, the second inorganic barrier layer 16D has no void and has a high adhesiveness with the organic barrier layer 14D.

As shown in FIG. 22(b), the organic barrier layer 14D may be ashed so as to remain as a thin film on the entire surface of the first inorganic barrier layer 12D except for the first inorganic barrier layer 12Da, namely, the protruding portion formed on the particle P. As described above, it is preferred from the point view of the bending resistance that the thickness of the organic barrier layer 14Db on the flat portion is 10 nm or greater and less than 200 nm.

Ashing may be performed non-uniformly in the plane; specifically, a part of the organic barrier layer 14D formed on the flat portion may be removed in the entire thickness thereof to expose the surface of the first inorganic barrier layer 12D. In addition, the material and the size of the particle P are varied, and therefore, there may be a portion having a structure shown in FIG. 22(a) or FIG. 15(a). It is preferred that the organic barrier layer 14D is controlled such that even if a part of the organic barrier layer 14D formed on the flat portion is removed in the entire thickness thereof, the organic barrier layer (solid portion) 14Db formed on the flat portion of the OLED 3, among various parts of the organic barrier layer 14D, has an area size larger than that of the opening 14Da. As described above, it is preferred that the area size of the solid portion 14Db is 80% or larger, and does not exceed about 90%, of the area size of the organic barrier layer 14D on the flat portion.

Figure 23:
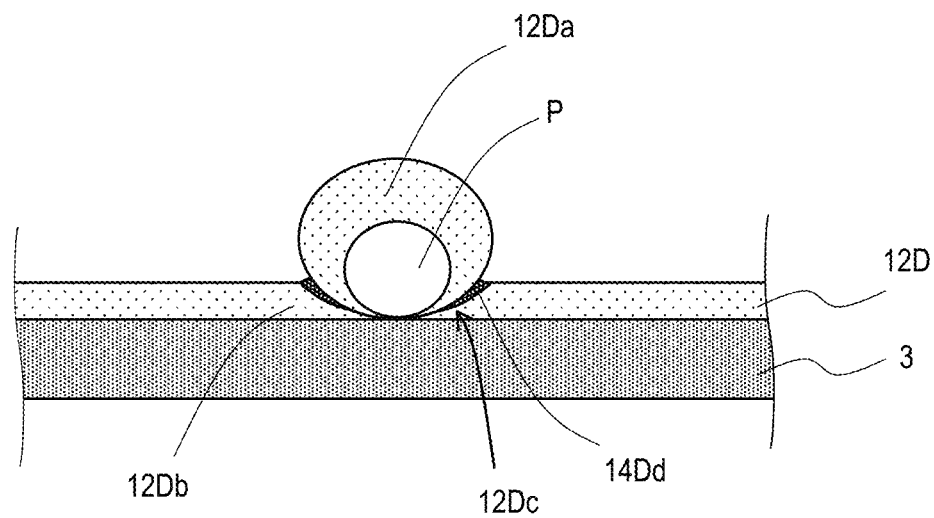
FIG. 23 is a schematic cross-sectional view showing an organic barrier layer 14Dd excessively ashed.
Figure 24:
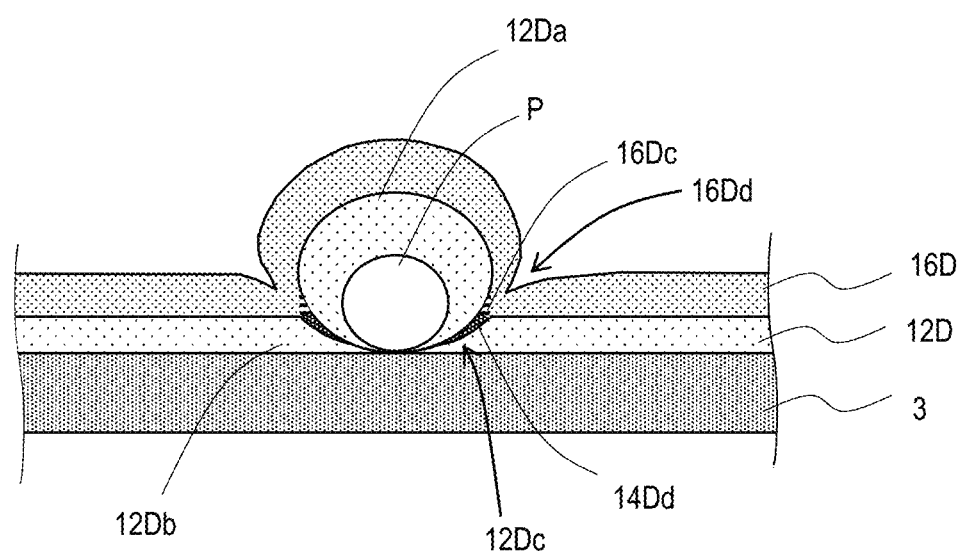
FIG. 24 is a schematic cross-sectional view showing the second inorganic barrier layer 16D formed on the organic barrier layer 14Dd excessively ashed.

In the case where the organic barrier layer 14D is ashed excessively, as shown in FIG. 23, the organic barrier layer 14Db formed on the flat portion of the OLED 3 is completely removed and also the size of the organic barrier layer 14Dd filling the crack 12Dc formed by the particle P is decreased. Thus, the organic barrier layer 14D does not act to smooth the surface of the underlying layer on which the second inorganic barrier layer 16D is to be formed. As a result, as shown in FIG. 24, a void 16Dc is formed in the second inorganic barrier layer 16D, which decreases the barrier property level of the TFE structure. Even if the void 16Dc is not formed, if a recessed portion 16Dd having a sharp angle is formed at a surface of the second inorganic barrier layer 16D, the stress is easily concentrated at the recessed portion and thus a crack is easily formed by an external force.

In an experiment using a convex lens formed of silica (diameter: 4.6 μm) as the particle P, there was a case where the organic barrier layer was excessively etched at an end of the silica convex lens, and as a result, the thickness of the second inorganic barrier layer was partially made excessively thin. In such a case, even if no void is formed in the second inorganic barrier layer, a crack may be formed in the second inorganic barrier layer when an external force is applied to the TFE structure during or after the production of the OLED display device.

An external force may be applied to the TFE structure 10 in the following cases. For example, at the time of peeling off the flexible substrate 1 of the OLED display device from a glass substrate as a support substrate, a bending stress is applied to the OLED display device including the TFE structure 10. At the time of bending the OLED display device along a predetermined curve shape during the production of a curved display, a bending stress is applied to the TFE structure 10. Needless to say, in the case where the OLED display device as a finished product is used as a flexible device (for example, the OLED display device is used as being folded, bent or rolled), various stresses are applied to the TFE structure 10 while the user uses the OLED display device.

In order to prevent this, it is preferred that the ashing conditions are adjusted such that more than 50% of the organic barrier layer formed on the flat portion of the OLED 3 remains (such that the area size of the organic barrier layer (solid portion) 14Db is larger than the area size of the opening 14Da). The organic barrier layer (solid portion) 14Db remaining on the flat portion of the OLED 3 is more preferably 80% or larger, and still more preferably about 90%. Nonetheless, it is further preferred that the opening 14Da is also present with the area size of about 10% because the opening 14Da provides an effect of suppressing the first inorganic barrier layer 12D and the organic barrier layer 14D from being delaminated from each other at the interface thereof and of suppressing the organic barrier layer 14D and the second inorganic barrier layer 16D from being delaminated from each other at the interface thereof. As shown in FIG. 22(a) through FIG. 22(a), the surface of the second inorganic barrier layer 16D, formed on the organic barrier layer 14D remaining in an appropriate amount, does not have a portion having an angle of 90 degrees or smaller (see the recessed portion 16Dd shown in FIG. 24). Therefore, even if an external force is applied, the concentration of a stress is suppressed.

A method for producing the OLED display device in embodiment 2 according to the present invention includes a step of providing, in a chamber, the OLED 3 and the first inorganic barrier layer 12D formed thereon, a step of supplying a vapor-like or mist-like photocurable resin (e.g., acrylic monomer) into the chamber, a step of condensing the photocurable resin on the first inorganic barrier layer 12D to form a liquid film, a step of irradiating the liquid film of the photocurable resin with light to form a photocurable resin layer (layer of the cured resin), and a step of partially ashing the photocurable resin layer to form the organic barrier layer 14D.

An ultraviolet-curable resin is preferably used as the photocurable resin. Thus, in the following, an example of using the ultraviolet-curable resin will be described. Alternatively, a visible light-curable resin may be used as long as a light source that emits light having a predetermined wavelength capable of curing a photocurable resin is used.

The film deposition apparatus 200 shown in FIG. 1A and FIG. 13B is usable to form the organic barrier layer 14 in, for example, the following manner. The following example is one typical example of conditions used to form the TFE structure 10 and a sample shown in the SEM photograph as a trial.

The acrylic monomer 26p is supplied to the chamber 210. The acrylic monomer 26p is introduced into the gap 224, passes the through-holes 222 of the shower plate 220, and is supplied to the element substrate 20 on the stage 212. The element substrate 20 has been cooled down to, for example, −15° C. on the stage 212. The acrylic monomer 26p is condensed on the first inorganic barrier layer 12D on the element substrate to become a liquid film. The supply amount of the acrylic monomer 26p and the temperature and the pressure (vacuum degree) in the chamber 21 may be controlled to adjust the deposition rate of the acrylic monomer (liquid). For example, the acrylic monomer may be deposited at a rate of 500 nm/min. Therefore, a layer of the acrylic monomer having a thickness of about 200 nm may be formed within about 24 seconds.

The above-mentioned conditions may be controlled such that the acrylic monomer is located locally, namely, only in the vicinity of the protruding portion, like in the method for forming the organic barrier layer in embodiment 1.

As the acrylic monomer, any of various known acrylic monomers is usable. A plurality of acrylic monomers may be mixed together. For example, a bifunctional monomer and a trifunctional or higher-level multi-functional monomer may be mixed. An oligomer may be mixed. It is preferred that the acrylic monomer is adjusted to have a viscosity of about 1 to about 100 mPa·s at room temperature (e.g., 25° C.). The acrylic monomer may be mixed with a photoinitiator when necessary.

After this, the gas in the chamber 210 is discharged, and the vapor-like or mist-like acrylic monomer 26p is removed. Then, as shown in FIG. 1, the acrylic monomer on the first inorganic barrier layer 12D is subjected to selective exposure to the laser beam 232 and thus is cured. In the case where the above-described high-output laser diode module is used, the selective exposure to light is completed within an irradiation time of about 10 seconds.

As described above, the tact time of the step of forming the organic barrier layer 14D is about 34 seconds, which provides a very high mass-productivity.

The first inorganic barrier layer 12D is formed, for example, as follows. The inorganic barrier layer 12D having a thickness of 400 nm may be formed by plasma CVD using $SiH_4$ gas and $N_2O$ gas, at a film deposition rate of 400 nm/min, in a state where, for example, the temperature of the substrate (OLED 3) on which the first inorganic barrier layer 12D is to be formed is controlled to be 80° C. or lower. The inorganic barrier layer thus formed has a refractive index of 1.84 and a 400 nm visible light transmittance of 90% (thickness: 400 nm). The film stress has an absolute value of 50 MPa.

The organic barrier layer 14D is ashed by, for example, plasma ashing using $N_2O$ gas. The ashing is performed in a chamber for ashing. The ashing rate is, for example, 500 nm/min. The ashing is performed for about 22 seconds such that when the organic barrier layer 14D having a thickness of 200 nm is formed as described above, the thickness (maximum value) of the organic barrier layer (solid portion) 14Db on the flat portion is about 20 nm.

The conditions in the above step may be controlled to form the organic barrier layer 14A shown in FIG. 14(a) and FIG. 14(b). The organic barrier layer 14D on the lead wires is thinner than the remaining portion of the organic barrier layer 14D. Therefore, the organic barrier layer 14D on the lead wires may be removed, and more than 50% of the organic barrier layer 14D on the flat portion may be left.

After the ashing, $N_2O$ gas is discharged, and the resultant body of layers is transported into a CVD chamber in which the second inorganic barrier layer 16D is to be formed. The second inorganic barrier layer 16D is formed under, for example, the same conditions as for the first inorganic barrier layer 12D.

As described above, the TFE structure 10D and the OLED display device including the TFE structure 10D are produced. In the method for producing the OLED display device in embodiment 2 according to the present invention, an organic barrier layer having a sufficient thickness is once formed and then ashed to have a desired thickness. This does not require a resin material to be located locally unlike the method described in Patent Document 2 or 3. Therefore, the process margin is large and the mass-productivity is high.

As described above, the surface of the organic barrier layer 14D is oxidized. Therefore, the surface of the organic barrier layer 14D is highly adhesive with the first inorganic barrier layer 12D and the second inorganic barrier layer 16D, and has a high level of moisture-resistance reliability. For example, the WVTR of the TFE structure 10D described above in a specific example (except that the OLED 3 was replaced with a polyimide film having a thickness of 15 μm) was evaluated. The WVTR was less than $1 \times 10^{-4}$ g/m²·day, which is the lowest possible measurable level as converted into room temperature.

In the case where the organic barrier layer 14D is provided between substantially the entire flat portions of the first inorganic barrier layer 12D and the second inorganic barrier layer 16D, the bending resistance is high.

The inorganic barrier layers may each be, instead of an SiN layer, an SiO layer, an SiON layer, an SiNO layer, an $Al_2O_3$ layer or the like. The resin used to form the organic barrier layer may be, instead of an acrylic resin, a photocurable resin such as a vinyl-containing monomer or the like. Alternatively, an ultraviolet-curable silicone resin may be used as the photocurable resin. A silicone resin (silicone rubber) has characteristics of having a high visible light transmittance and a high climate resistance, and not being easily yellowed even after being used for a long time. A photocurable resin that is cured by visible light may be used. The viscosity of a photocurable resin used in an embodiment according to the present invention at room temperature (e.g., 25° C.), before the photocurable resin is cured, preferably does not exceed 10 Pa·s, and especially preferably is in the range of 1 to 100 mPa*s as described above.

In each of the above-described embodiments, a display device is produced as an example of organic EL device. The present invention is also applicable to production of an organic EL device other than the display device, for example, an organic EL illumination device. The substrate is not limited to a flexible substrate but may be formed of a highly rigid material. The display device is not limited to being of a small or middle size, but may be of a large size for a large-screen TV.

INDUSTRIAL APPLICABILITY

An embodiment of the present invention is applicable to an organic EL display device, especially, a flexible EL display device, and a method for producing the same.

REFERENCE SIGNS LIST

1: Substrate
2: Back plane circuit
3: OLED
4: Polarization plate
10, 10A, 10D: Thin film encapsulation structure (TFE structure)
12, 12A, 12D: First Inorganic barrier layer (SiN layer)
14, 14A, 14D: Organic barrier layer (acrylic resin layer)
14Da: Opening of the organic barrier layer
14Db: Solid portion of the organic barrier layer
14Ds: Surface of the organic barrier layer (after ashing)
14Dsa: Surface of the organic barrier layer (before ashing)
16A, 16D: Second inorganic barrier layer (SiN layer)
16Da: Void
16Dd: Recessed portion
20 Element substrate
26: Acrylic monomer
26$p$: Vapor-like or mist-like acrylic monomer
100, 100A: Organic EL display device
210: Chamber
212: Stage
220: Shower plate
222: Through-hole
224: Gap
230: Light source device
232: Laser beam
234: Partition wall

The invention claimed is:

1. A method for producing an organic EL device, comprising the steps of:
providing an element substrate comprising a substrate that includes an active region and a peripheral region outer to the active region and also comprising an electrical circuit supported by the substrate, the electrical circuit including a plurality of EL elements formed on the active region and a back plane circuit for driving the plurality of organic EL elements, the back plane circuit including a plurality of lead wires each including a terminal on the peripheral region; and
forming a thin film encapsulation structure over the plurality of EL elements in the element substrate and on a part of the plurality of lead wires that is on the active region;
wherein the step of forming the thin film encapsulation structure includes the steps of:
forming a first inorganic barrier layer over the element substrate;
condensing a photocurable resin in a liquid-state on the first inorganic barrier layer;
irradiating a selected region of the photocurable resin with a laser beam having a wavelength of 400 nm or shorter to cure at least a part of the photocurable resin, thus to form a photocurable resin layer while forming an opening in the photocurable resin layer on each of the plurality of lead wires;
ashing a part of a surface of the photocurable resin layer to form an organic barrier layer; and
forming a second inorganic barrier layer, covering the organic barrier layer, on the first inorganic barrier layer.

2. The method of claim 1, wherein in the step of condensing the photocurable resin in the liquid state, the photocurable resin condensed on a flat portion of the first inorganic barrier layer has a thickness of 100 nm or greater and 500 nm or less.

3. The method of claim 1, wherein the step of forming the organic barrier layer includes the step of generating the laser beam from laser light emitted from at least one semiconductor laser device.

4. The method of claim 1, wherein the substrate is a flexible substrate.

5. The method of claim 1, wherein the photocurable resin contains an acrylic monomer.

6. A method for producing an organic EL device, comprising the steps of:
providing an element substrate including a substrate and a plurality of organic EL devices arranged on the substrate; and
forming a thin film encapsulation structure over the element substrate;
wherein the step of forming the thin film encapsulation structure includes the steps of:
forming a first inorganic barrier layer over the element substrate;
condensing a photocurable resin on the first inorganic barrier layer;
irradiating a plurality of selected regions of the photocurable resin with a laser beam to cure at least a part of the photocurable resin, thus to form a photocurable resin layer;
removing an uncured part of the photocurable resin; and
forming a second inorganic barrier layer, covering the photocurable resin layer remaining on the substrate, on the first inorganic barrier layer,
wherein the plurality of regions of the photocurable resin are selected such that an active region of each of the organic EL devices is enclosed by a region where the first inorganic barrier layer and the second inorganic barrier layer are in contact with each other without having an organic barrier layer therebetween.

7. The method of claim 6, wherein the plurality of regions of the photocurable resin are separated from each other.

8. A film deposition apparatus, comprising:
a chamber comprising a stage for supporting a substrate;
a material supply device for supplying a vapor-like or mist-like photocurable resin into the chamber; and
a light source device for irradiating a plurality of selected regions of the substrate supported by the stage with a laser beam;
wherein the light source device includes:
at least one semiconductor laser device for emitting the laser beam; and
an optical device for adjusting an intensity distribution, on the substrate, of the laser beam emitted from the semiconductor laser device.

9. The apparatus of claim 8, wherein the optical device includes at least one movable mirror for scanning the plurality of selected regions of the substrate with the laser beam.

10. The apparatus of claim 8, wherein the light source device includes a plurality of semiconductor laser devices including the at least one semiconductor laser device, and irradiates the plurality of selected regions of the substrate with a plurality of laser beams emitted from the plurality of semiconductor laser devices.

11. The apparatus of claim 10, wherein the light source device includes a driving device for moving the plurality of semiconductor laser devices with respect to the substrate.

12. The apparatus of claim 8, wherein the optical device adjusts the intensity distribution such that at least a part of the photocurable resin condensed on the substrate is not cured.

13. The apparatus of claim 8, wherein the optical device includes a transmissive or reflective spatial light modulation element modulating the intensity distribution.

* * * * *